(12) United States Patent
Hermes et al.

(10) Patent No.: US 12,382,747 B2
(45) Date of Patent: Aug. 5, 2025

(54) METHOD FOR SELECTING AN OPTICAL SENSOR

(71) Applicant: trinamiX GmbH, Ludwigshafen am Rhein (DE)

(72) Inventors: Wilfried Hermes, Ludwigshafen (DE); Sebastian Valouch, Ludwigshafen (DE); Sebastian Mueller, Ludwigshafen (DE); Regina Hoeh, Ludwigshafen (DE); Heidi Bechtel, Ludwigshafen (DE); Timo Altenbeck, Ludwigshafen (DE); Fabian Dittmann, Ludwigshafen (DE); Bertram Feuerstein, Ludwigshafen (DE); Thomas Hupfauer, Ludwigshafen (DE); Anke Handreck, Ludwigshafen (DE); Robert Gust, Ludwigshafen (DE); Peter Paul Kaletta, Ludwigshafen (DE); Robert Send, Ludwigshafen (DE); Hubert Waindok, Ludwigshafen (DE); Ingolf Hennig, Ludwigshafen (DE); Svetlana Guriyanova, Ludwigshafen (DE)

(73) Assignee: TRINAMIX GMBH, Ludwigshafen am Rhein (DE)

( * ) Notice: Subject to any disclaimer, the term of this patent is extended or adjusted under 35 U.S.C. 154(b) by 968 days.

(21) Appl. No.: 17/438,714

(22) PCT Filed: Mar. 13, 2020

(86) PCT No.: PCT/EP2020/056760
§ 371 (c)(1),
(2) Date: Sep. 13, 2021

(87) PCT Pub. No.: WO2020/187720
PCT Pub. Date: Sep. 24, 2020

(65) Prior Publication Data
US 2022/0131021 A1    Apr. 28, 2022

(30) Foreign Application Priority Data

Mar. 15, 2019 (EP) .................................... 19163077

(51) Int. Cl.
*H10F 77/12*    (2025.01)
*H01L 21/66*    (2006.01)
(Continued)

(52) U.S. Cl.
CPC ........... *H10F 77/127* (2025.01); *H01L 22/12* (2013.01); *H10F 30/10* (2025.01); *H10F 71/125* (2025.01); *H10F 77/30* (2025.01)

(58) Field of Classification Search
CPC ...... H10F 30/10; H10F 71/125; H10F 77/127; H01L 22/12
See application file for complete search history.

(56) References Cited

U.S. PATENT DOCUMENTS

| | | | | |
|---|---|---|---|---|
| 6,134,954 A | * | 10/2000 | Suresh | G01N 3/42 702/33 |
| 2015/0017549 A1 | * | 1/2015 | Nishimura | H01M 4/485 429/231.95 |

(Continued)

FOREIGN PATENT DOCUMENTS

| | | |
|---|---|---|
| WO | 2012110924 A1 | 8/2012 |
| WO | 2014097181 A1 | 6/2014 |

(Continued)

OTHER PUBLICATIONS

Mukherjee et al. "Synthesis of band gap engineered PbXCd1-XSe thin films: A study on their optical electrical, structural and localized mechanical properties." Physica Status Solidi, A: Applications and Materials Science, vol. 207, No. 8, pp. 1880-1886. Jun. 7, 2010.

(Continued)

*Primary Examiner* — Yara B Green
*Assistant Examiner* — Christopher M Roland
(74) *Attorney, Agent, or Firm* — Armstrong Teasdale LLP

(57) ABSTRACT

Described herein is an optical sensor, a detector for an optical detection including the optical sensor, a method for manufacturing the optical sensor and various uses of the optical detector. The optical sensor includes a stack.

11 Claims, 5 Drawing Sheets

(51) Int. Cl.
   *H10F 30/10*    (2025.01)
   *H10F 71/00*    (2025.01)
   *H10F 77/30*    (2025.01)

(56) References Cited

U.S. PATENT DOCUMENTS

2019/0172964 A1* 6/2019 Hermes .................. H10F 77/50
2021/0025761 A1* 1/2021 Altenbeck ............. H10F 77/413

FOREIGN PATENT DOCUMENTS

| WO | 2016120392 A1 | 8/2016 | |
| WO | WO-2018019921 A1 * | 2/2018 | ........... H01L 31/095 |
| WO | 2020148381 A1 | 7/2020 | |

OTHER PUBLICATIONS

Darrow et al. "Micro-indentation hardness variation as a function of composition for polycrystalline solutions in the systems PbS/PbTe, PbSe/PbTe, and PbS/PbSe." Journal of Materials Science, vol. 4, No. 4, pp. 313-319. Apr. 1, 1969.
International Search Report and Written Opinion for corresponding PCT/EP2020/056760 mailed Jun. 25, 2020, 17 Pages.

* cited by examiner

METHOD FOR SELECTING AN OPTICAL SENSOR

CROSS-REFERENCE TO RELATED APPLICATIONS

This application is a U.S. National Phase Application of International Patent Application No. PCT/EP2020/056760, filed Mar. 13, 2020, which claims priority to European Patent Application No. 19163077.1 filed Mar. 15, 2019, the entire contents of which are hereby incorporated by reference herein.

FIELD OF THE INVENTION

The invention relates to an optical sensor and to a detector comprising such an optical sensor for an optical detection, in particular of optical radiation, especially within the infrared spectral range, specifically with regard to sensing at least one of transmissivity, absorption, emission and reflectance, provided by at least one light beam, or for determining a position of at least one object, specifically with regard to a depth or both to the depth and a width of the at least one object. Further, the invention relates to a method for manufacturing the optical sensor and to various uses of the optical sensor and the detector. Such devices, methods and uses can be employed in various areas of safety technology, specifically in form of safety related-devices, such as gas sensors, spark sensors, or flame sensors. However, further applications, especially in the field of security technology, are also possible.

PRIOR ART

Various detectors for optically detecting at least one object are known on the basis of optical sensors.

WO 2012/110924 A1 discloses a detector comprising at least one optical sensor, wherein the optical sensor exhibits at least one sensor region. Herein, the optical sensor is designed to generate at least one sensor signal in a manner dependent on an illumination of the sensor region. According to the FIP effect as described therein, the sensor signal, given the same total power of the illumination, is hereby dependent on a geometry of the illumination, in particular on a beam cross-section of the illumination on the sensor region. The detector furthermore has at least one evaluation device designated to generate at least one item of geometrical information from the sensor signal, in particular at least one item of geometrical information about the illumination and/or the object.

WO 2014/097181 A1 discloses a method and a detector for determining a position of at least one object, by using at least one transversal optical sensor and at least one longitudinal optical sensor. Preferably, a stack of longitudinal optical sensors is employed, in particular to determine a longitudinal position of the object with a high degree of accuracy and without ambiguity. Further, WO 2014/097181 A1 discloses a human-machine interface, an entertainment device, a tracking system, and a camera, each comprising at least one such detector for determining a position of at least one object.

WO 2016/120392 A1 discloses further kinds of materials which are suitable as longitudinal optical sensor. Herein, a sensor region of the longitudinal optical sensor comprises a photoconductive material, wherein an electrical conductivity in the photoconductive material, given the same total power of the illumination, is dependent on the beam cross-section of the light beam in the sensor region. Thus, the longitudinal sensor signal is dependent on the electrical conductivity of the photo-conductive material. Preferably, the photoconductive material is selected from lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), or copper zinc tin sulfide (CZTS). Further, solid solutions and/or doped variants thereof are also feasible. Further, a transversal optical sensor having a sensor area is disclosed, wherein the sensor area comprises a layer of the photo-conductive material, preferentially embedded in between two layers of a transparent conducting oxide, and at least two electrodes. Preferably, at least one of the electrodes is a split electrode having at least two partial electrodes, wherein transversal sensor signals provided by the partial electrodes indicate an x- and/or a y-position of the incident light beam within the sensor area.

WO 2018/019921 A1 discloses an optical sensor comprising a layer of at least one photoconductive material, at least two individual electrical contacts contacting the layer of the photoconductive material, and a cover layer deposited on the layer of the photoconductive material, wherein the cover layer is an amorphous layer comprising at least one metal-containing compound. The optical sensor can be supplied as a non-bulky hermetic package which, nevertheless, provides a high degree of protection against possible degradation by humidity and/or oxygen. Moreover, the cover layer is capable of activating the photoconductive material which results in an increased performance of the optical sensor. Further, the optical sensor may be easily manufactured and integrated on a circuit carrier device.

In addition, European patent application 19 152 511.2, filed Jan. 18, 2019, discloses an optical sensor which comprises a substrate, a layer of at least one photoconductive material which is directly or indirectly applied to the substrate, at least two individual electrical contacts contacting the layer of the photoconductive material, and a cover covering accessible surfaces of the photoconductive material and of the substrate, wherein the cover is an amorphous cover which comprises at least one metal-containing compound.

In particular, optical sensors which comprise at least one photoconductive material are, typically, used in safety related-devices such as gas sensors, spark sensors, or flame sensors. In addition, other kinds of applications, especially in the field of security technology, are also possible. Consequently, it is desired to maintain a high performance and stability of the optical sensor over a long time in order to meet the particular requirements which are characteristic to these fields of application. Despite the advantages implied by the above-mentioned devices and detectors, in particular with respect to the advantages achieved by reactive encapsulation as, for example, expressed in WO 2018/019921 A1 and European patent application 19 152 511.2, filed Jan. 18, 2019, which have significantly improved the performance and the long-term stability of the optical sensors, there is, still, a need for improvements with respect to a simple, cost-efficient and, still, reliable optical sensor and spatial detector. N. Mukherjee, G. G. Khan, A. Sinha, and A. Mondal, *Synthesis of band gap engineered applications and materials science $Pb_xCd_{1-x}Se$ thin films: A study on their optical, electrical, structural and localized mechanical properties*, Phys. Status Solidi A 207, No. 8, 1880-1886

(2010), describe a novel electrochemical technique to prepare band gap engineered IV-II-VI type ternary solid solution system of $Pb_xCd_{1-x}Se$. We have used a self-sufficient modified electrochemical cell made up of Pb anode and a transparent conducting oxide (TCO) coated glass cathode, containing $Pb(CH_3COO)_2$, $Cd(CH_3COO)_2$, $H_2SeO_3$ and $Na_2EDTA$ solutions with proper concentrations as the working electrolyte. X-ray diffraction (XRD) pattern analysis confirms the formation of highly crystalline $Pb_xCd_{1-x}Se$, whereas, scanning electron micrograms (SEM) reveals a uniform deposition with compact surface morphology. Good rectifying behavior of the $TCO/Pb_xCd_{1-x}Se$ hetero-junction was established from current-voltage measurements, which indicate the p-type conduction nature of the deposited ternary compound. Mechanical properties of such thin films were measured by nano-indentation.

M. S. Darrow, W. B. White, and R. Roy, *Micro-Indentation Hardness Variation as a Function of Composition for Polycrystalline Solutions in the Systems PbS/PbTe, PbSe/PbTe, and PbS/PbSe*, Journal of Materials Science 4 (1969) 313-319, describe that Vickers micro-indentation hardness as a function of composition has been measured for polycrystalline solutions of lead chalcogenide systems and results compared to exsolution tendencies as implied by subsolidus features of the phase diagrams. Each system exhibited a positive deviation from a linear hardness relation between the end member compounds. The most pronounced hardening was observed for PbS/PbTe solutions; the maximum hardness occurs at about 30 mole % Pb Te, coincident with a large solubility gap with a solvus maximum (critical point) at about 30 mol. % Pb Te and approximately 805° C. The least amount of hardening was observed for the system PbS/PbSe, which exhibits no exsolution at temperatures as low as 300° C. The hardness versus composition curve was approx. symmetric about the 50 mol. % composition. Intermediate between these two systems, the PbSe/PbTe crystalline solutions exhibited an asymmetric hardness/composition curve with maximum hardness at about 30 mol. % PbTe. Partial phase studies indicate the possibility of a solvus maximum at 500 to 600° C. on the PbSe-rich side of the diagram.

Problem Addressed by the Invention

Therefore, a problem addressed by the present invention is that of specifying a device and a method for an optical detection which at least substantially avoids the disadvantages of known devices and methods of this type.

In particular, it would be desirable to provide an optical sensor which comprises at least one photoconductive material and a detector for optical detection which comprises such an optical sensor, wherein high performance and stability of the optical sensor could be maintained over a long time in order to meet the particular requirements for application as a safety related-device, such as a gas sensor, a spark sensor, or a flame sensor, as well as for applications in the field of security technology.

SUMMARY OF THE INVENTION

This problem is solved by the invention with the features of the independent patent claims. Advantageous developments of the invention, which can be realized individually or in combination, are presented in the dependent claims and/or in the following specification and detailed embodiments.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents or elements are present in A.

In a first aspect of the present invention, an optical sensor is disclosed. Herein, the optical sensor according to the present invention comprises a stack, wherein the stack has
a substrate,
a layer of at least one photoconductive material which is applied to the substrate,
a cover covering accessible surfaces of the layer of the photoconductive material.
and at least two individual electrical contacts which are spatially separated from the stack and contact the layer of the photoconductive material,
wherein the optical sensor exhibits that, in a quasi-static nanoindenter measurement of the stack, Young's modulus
at a penetration depth of 100 nm is of 75 GPa to 107 GPa,
at the penetration depth of 300 nm is of 47 to 127 GPa,
at the penetration depth of 1000 nm is of 49 to 119 GPa, and a hardness
at the penetration depth of 100 nm is of 1.20 GPa to 4.70 GPa,
at the penetration depth of 300 nm is of 1.60 GPa to 4.60 GPa,
at the penetration depth of 1000 nm is of 1.60 GPa to 8.00 GPa.

As used herein, the "optical sensor" is generally a device which is designed to generate at least one sensor signal in a manner dependent on an illumination of a sensor region by a light beam. The sensor signal may generally be an arbitrary signal indicative of at least one of transmissivity, absorption, emission and reflectance of an incident light beam illuminating the sensor region, wherein the incident light beam may be provided by an object. As an example, the sensor signal may be or may comprise a digital and/or an analog signal. As an example, the sensor signal may be or may comprise a voltage signal and/or a current signal. Additionally or alternatively, the sensor signal may be or may comprise digital data. The sensor signal may comprise a single signal value and/or a series of signal values. The sensor signal may further comprise an arbitrary signal which is derived by combining two or more individual signals, such as by averaging two or more signals and/or by forming a quotient of two or more signals.

The "object" generally may be an arbitrary object, chosen from a living object and a non-living object. Thus, as an example, the at least one object may comprise one or more articles and/or one or more parts of an article. Additionally or alternatively, the object may be or may comprise one or more living beings and/or one or more parts thereof, such as one or more body parts of a human being, e.g. a user, and/or an animal.

As used herein, a "position" generally refers to an arbitrary item of information on a location and/or orientation of the object in space. For this purpose, as an example, one or more coordinate systems may be used, and the position of the object may be determined by using one, two, three or more coordinates. Herein, a first coordinate may refer to a depth of an object which refers to a distance between the optical sensor and the object while two other coordinates which may be perpendicular to the first coordinate may refer to a width of the object. As an example, one or more Cartesian coordinate systems and/or other types of coordinate systems may be used. In one example, the coordinate system may be a coordinate system of the detector in which the detector has a predetermined position and/or orientation.

According to the present invention, the optical sensor comprises a layer of at least one photoconductive material, wherein the layer of the photoconductive material may function as a sensor region. As used herein, the "sensor region" is considered as a partition of the optical sensor being designed to receive the illumination of the optical sensor by the light beam, wherein the illumination in a manner as received by the sensor region may trigger the generation of the at least one sensor signal, wherein the generation of the sensor signal may be governed by a defined relationship between the sensor signal and the manner of the illumination of the sensor region. According to the present invention, the sensor region is formed by the photoconductive layer or a partition thereof. Herein, the sensor area may be formed as a single sensor area. In a particular embodiment, the photoconductive layer may comprise at least two individual sensor areas, preferably an array of individual sensor areas, which are directly or indirectly applied to the same substrate, also denoted as "common substrate", which may, thus, exhibit a considerably large area.

As used herein, the term "photoconductive material" refers to a material which is capable of sustaining an electrical current and, therefore, exhibits a specific electrical conductivity, wherein, specifically, the electrical conductivity is dependent on the illumination of the material. Since an electrical resistivity is defined as the reciprocal value of the electrical conductivity, alternatively, the term "photoresistive material" may also be used to denominate the same kind of material. In this kind of material, the electrical current may be guided via at least one first electrical contact through the material to at least one second electrical contact, wherein the first electrical contact is isolated from the second electrical contact while both the first electrical contact and the second electrical contact are in direct connection with the material. For this purpose, the direct connection may be provided by any known measure known from the state of the art, such as plating, welding, soldering, wire bonding, thermosonic bonding, stitch-bonding, ball-bonding, wedge bonding, compliant bonding, thermocompression bonding, anodic bonding, direct bonding, plasma-activated bonding, eutectic bonding, glass frit bonding, adhesive bonding, transient liquid phase diffusion bonding, surface activated bonding, tape-automated bonding, or depositing electrically highly conductive substances, in particular metals like gold, beryllium doped gold, copper, aluminum, silver, platinum, or palladium as well as alloys comprising at least one of the mentioned metals, at the contact zones.

For the purposes of the present invention, the photoconductive material as used in the sensor region of the optical sensor may, preferably, comprise an inorganic photoconductive material, and/or a solid solution thereof and/or a doped variant thereof. As used herein, the term "solid solution" refers to a state of the photoconductive material in which at least one solute may be comprised in a solvent, whereby a homogeneous phase is formed and wherein the crystal structure of the solvent may, generally, be unaltered by the presence of the solute. By way of example, the binary PbSe may be solved in PbS leading to $PbS_{1-x}Se_x$, wherein x can vary from 0 to 1. As further used herein, the term "doped variant" may refer to a state of the photoconductive material in which single atoms apart from the constituents of the material itself are introduced onto sites within the crystal which are occupied by intrinsic atoms in the undoped state.

In this regard, the inorganic photoconductive material may, in particular, comprise one or more of selenium, tellurium, a selenium-tellurium alloy, a metal oxide, a group IV element or compound, i.e. an element from group IV or a chemical compound with at least one group IV element, a group III-V compound, i.e. a chemical compound with at least one group III element and at least one group V element, a group II-VI compound, i.e. a chemical compound with, on one hand, at least one group II element or at least one group XII element and, on the other hand, at least one group VI element, and/or a chalcogenide, which might, preferably, be selected from a group comprising sulfide chalcogenides, selenide chalcogenides, ternary chalcogenides, quaternary and higher chalcogenides. As generally used, the term "chalcogenide" refers to a compound which may comprise a group 16 element of the periodic table apart from an oxide, i.e. a sulfide, a selenide, and a telluride. Further, the term "chalcogenide" may also refer to mixed chalcogenides, such as sulfoselenides.

In a particularly preferred embodiment of the present invention, the photoconductive material as used in the optical sensor may be selected from a lead chalcogenide, preferably lead sulfide (PbS), a solid solution and/or a doped variant thereof. Since the particularly preferred photoconductive material are, generally, known to exhibit a distinctive absorption characteristic within the infrared spectral range, the optical sensor having the layer which comprises the mentioned preferred photoconductive material may, preferably, be used as an infrared sensor. However, other embodiments and/or other photoconductive materials, such as disclosed in WO 2018/019921 A1 and European patent application 19 152 511.2, filed Jan. 18, 2019, may also be feasible.

With regard to the photoconductive materials, layers of those materials which may comprise at least a few crystals exhibiting a size above 15 nm are included. Herein, the layer of the photoconductive material may be fabricated by applying at least one deposition method which may be selected from the group consisting of: vacuum evaporation, sputtering, atomic layer deposition, chemical vapor deposition, spray pyrolysis, electrodeposition, anodization, electro-conversion, electro-less dip growth, successive ionic adsorption and reaction, chemical bath deposition, and solution-gas interface techniques. As a result, the layer of the photoconductive material may exhibit a thickness of 10 nm to 100 µm, preferably of 100 nm to 10 µm, more preferred of 300 nm to 5 µm. However other photoconductive materials as mentioned above and/or below may also be feasible for this purpose and may also be treated in the same or in a similar fashion.

Preferably, the photoconductive material may be fabricated by depositing the respective material on an insulating substrate, preferably on a substrate as described below in more detail, in particular for providing mechanical stability to the layer of the photoconductive material. In this manner, by depositing the selected layer on the appropriate substrate and providing at least two individual electrical contacts, the optical sensor according to the present invention can, thus, be obtained. Herein, an illumination of the photoconductive material in the sensor region by an incident light beam results in a variation of the electrical conductivity in the illuminated layer of the photoconductive material.

As mentioned above, the layer of the photoconductive material may be applied to at least one substrate. As generally used, the term "substrate" refers to an elongated body which is adapted for carrying a layer of a material, specifically of the photoconductive material as used herein in particular for providing mechanical stability to the layer of the photoconductive material. Hereby, the layer of the photoconductive material may be applied indirectly or, preferably, directly to the substrate. Herein, the term "directly" refers to an immediate attachment of the layer of the photoconductive material to the substrate whereas the term "indirectly" refers to an attachment of the layer of the photoconductive material to the substrate via at least one intermediate layer, such as a bonding layer. Preferably, the substrate may be provided as a layer having lateral extensions which exceed a thickness of the layer by a factor of at least 5, preferably of at least 25, more preferred of at least 100. In particular, the thickness of the substrate may be of 10 µm to 2000 µm, preferably of 50 µm to 1000 µm, more preferred of 100 µm to 500 µm.

Preferably, at least one of the substrate and the cover may be optically transparent within a selected wavelength range, specifically within the infrared spectral range or a partition thereof as indicated elsewhere herein. Consequently, it may, particularly, be advantageous to select the material as used for the cover to be, preferably, optically transparent within the desired wavelength range, in particular, by exhibiting a suitable absorption characteristic. Alternatively or in addition, the material applied for the substrate may exhibit optically transparent properties within the desired wavelength range. In particular, this feature may allow selecting a wider range of materials for the cover material which may not to be optically transparent within the desired wavelength range as along as the substrate may exhibit sufficient transparency. For this purpose, the substrate may, in particular, comprise at least one at least partially transparent insulating material, wherein the insulating material may, preferably, be selected from at least one of glass, quartz, fused silica, a metal oxide, or a ceramic material, preferably sapphire ($Al_2O_3$), wherein glass or quartz are particularly preferred.

In a particularly preferred embodiment, the substrate may be directly or indirectly applied to a circuit carrier device, such as a printed circuit board (PCB). Herein, the term "printed circuit board", which is usually abbreviated to "PCB", refers to an electrically non-conductive, planar board, on which at least one sheet of an electrically conductive material, in particular a copper layer, is applied to, specifically laminated, onto the board. Other terms which refer to this type of circuit carrier which, in addition, comprises one or more electronical, electrical, and/or optical elements may also be denoted as a printed circuit assembly, short "PCA", a printed circuit board assembly, short "PCB assembly" or "PCBA", circuit card assembly or short "CCA" or simply "card". In the PCB, the board may comprise a glass epoxy, wherein a cotton paper impregnated with a phenolic resin, typically tan or brown, may also be sued as the board material. Depending on a number of sheets, the printed circuit board may be a single-sided PCB, a two-layer or double-sided PCB, or a multi-layer PCB, wherein different sheets are connected with each other by using so-called "vias". For the purposes of the present invention, an application of a single-sided PCB may be sufficient; however other kinds of printed circuit boards may also be applicable. A double-sided PCB may have metal on both sides while a multi-layer PCB may be designed by sandwiching additional metal layers between further layers of insulating material. In a multi-layer PCB, the layers can be laminated together in an alternating manner, wherein each metal layer may be individually etched and wherein internal vias may be plated through before the multiple layers are laminated together. Further, the vias may be or comprise copper-plated holes which can, preferably, be designed as electrically conducting paths through the insulating board.

The substrate which carries the layer of the photoconductive material, the corresponding electrical contacts, and, if applicable, further layers may be placed onto the circuit carrier device, such as the PCB, specifically by gluing, soldering, welding, or otherwise depositing it directly or indirectly on an adjacent surface of the circuit carrier device. By way of example, the substrate may be attached to the circuit carrier device, such as the PCB, by a thin film of glue placed between adjacent surfaces of the substrate and of the circuit carrier device, such as the PCB. For further embodiments of the printed circuit board, reference may be made to https://en.wikipedia.org/wiki/Printed_circuit_board. Alternatively, other kinds of circuit carriers may, however, also be applicable.

Further, the optical sensor according to the present invention comprises a cover which covers an accessible surface of the photoconductive material and, preferably, also of the substrate. As generally used, the phrase "accessible surface" refers to a portion of a body, specifically of the layer of the photoconductive material or, if applicable, of the substrate, which can be reached by an atmosphere surrounding the optical sensor. Preferably, the cover may be applied in a manner that it may directly contact a top and sides of a layer of the photoconductive material and at least the sides of the substrate. As already indicated above, the substrate carries the layer of the photoconductive material, such that the top of the layer of the photoconductive material refers to an extended surface of the layer of the photoconductive material which is neither directly nor indirectly applied to the substrate. As generally used, the term "layer" refers to an elongated body which comprises two extended surfaces between which sides are arranged. Since both the photoconductive material and the substrate are provided as a layer, they comprise sides, respectively.

In a preferred embodiment, the cover may fully cover the accessible surface of both the layer of the photoconductive material and of the sides of the substrate, in particular in a preferred arrangement in which the substrate may be attached to a circuit carrier device, such as a PCB, specifically in a manner as described above. In this preferred embodiment, the cover may be a continuous coating which continuously covers both the layer of the photoconductive material and of the sides of the substrate. As a result, the cover may coat all accessible surfaces of both the photoconductive material and of the substrate, thus preventing a direct contact between the material of the photoconductive layer or of the substrate with a surrounding atmosphere, thereby avoiding a degradation of the photoconductive material by external influence, such as humidity and/or oxygen. However, as disclosed in WO 2018/019921 A1, a cover which is only deposited on the layer of the photoconductive material may already improve the long-term stability of the optical sensor. As a result, the cover contributes to a reduction or exclusion of external influences by minimizing or diminishing an effect of humidity and/or oxygen onto the layer of the photoconductive material. The cover which, in addition, also covers the accessible surfaces of the substrate may improve such effects by blocking and/or obstructing paths that may be capable of transferring humidity and/or oxygen through or along the surface of the substrate to the layer of the photoconductive material.

Thus, the cover may be adapted for providing an improved encapsulation for the photoconductive material. As used herein, the term "encapsulation" may refer to a package, preferably, an hermetic package, especially, in order to avoid as far as possible a partial or full degradation of the optical sensor or a partition thereof, in particular of the photoconductive material comprised within the sensor region of the optical sensor, by external influence, such as by humidity and/or by oxygen comprised in a surrounding atmosphere. Herein, the package may, preferably, be adapted to cover all accessible surfaces of the photoconductive material, wherein it may be taken into account that the layer of the photoconductive material may be deposited on a substrate which may already be adapted to protect a partition of the surfaces of the photoconductive material. In other words, the substrate and the cover may be adapted in a fashion that they can cooperate in order to accomplish an improved packaging, preferably an improved hermetic packaging, of the photoconductive material.

Preferably, at least one deposition method may be used for depositing the cover. For this purpose, the at least one deposition method may, in particular, be selected from an atomic layer deposition, a chemical vapor deposition, a sputtering process, or a combination thereof. Consequently, the cover may, in a particularly preferred embodiment, be or comprise an atomic deposition coating, a chemical vapor deposition coating, a sputtered coating, or a coating generated by using at least two of the mentioned deposition methods, wherein the atomic deposition coating or a coating generated by using a combination of atomic deposition and sputtering may especially by preferred. In other words, the cover may, in this particularly preferred embodiment, be obtainable by an ALD process, a CVD process, a sputtering process, or a combination thereof, the ALD process or the combination of ALD and sputtering being especially preferred. In particular, the cover may comprise at least one metal-containing compound, wherein the at least one metal may be selected from the group consisting of Al, Ti, Ta, Mn, Mo, Zr, Hf, and W. Further, the at least one metal-containing compound may, preferably, be selected from the group comprising an oxide, a hydroxide, or a combination thereof. Thus, the metal-containing compound may, preferably, comprise at least one oxide, at least one hydroxide, or a combination thereof, preferably of Al, Ti, Zr or Hf. In a particularly preferred embodiment of the present invention, the metal-containing compound as comprised by the cover may be a composition comprising aluminum oxide and/or aluminum hydroxide, which is, as generally used, for sake of simplicity also referred to as $Al_2O_3$. Further, the cover may exhibit a thickness of 10 nm to 600 nm, preferably of 20 nm to 200 nm, more preferred of 40 nm to 120 nm, most preferred of 50 to 95 nm. This thickness may, particularly, reflect the amount of metal-containing compounds within the cover that may be advantageous to achieve the above-mentioned functions of providing encapsulation for the photoconductive material.

In a further particularly preferred embodiment of the present invention, the cover may be conformal with respect to an adjacent surface of the photoconductive material or of the substrate. As defined above, the thickness of the conformal cover may, thus, follow the corresponding surface of the photoconductive material or of the substrate within a deviation of ±50 nm, preferably of ±20 nm, mostly preferred of ±10 nm, wherein the deviation may occur over at least for at least 90%, preferably for at least 95%, mostly preferred for at least 99%, of a surface of the cover, hereby leaving aside any contamination or imperfection that may be present on the surface of the cover.

In a particularly preferred embodiment, the cover may partially or fully cover the electrical contacts, which may, especially, be configured to be bondable, such as to one or more leads to an external circuit. Herein, the electrical contacts may be bondable by using wires, such as gold or aluminum wires, wherein the electrical contacts may, preferably, be bondable through the cover. In a particular embodiment, an adhesive layer may be provided at the electrical contacts, wherein the adhesive layer may, especially, be adapted for bonding. For this purpose, the adhesive layer may comprise at least one of Ni, Cr, Ti or Pd.

In accordance with the present invention, the substrate, the layer of the photoconductive material, and the cover are arranged in form of a stack, wherein the electrical contacts which contact the layer of the photoconductive material are spatially separated from the stack. As generally used, the term "stack" refers to an arrangement which comprises at least two individual layers, wherein one of the individual layers is arranged on top of another of the individual layers with respect to a particular direction. With respect to the stack as described herein, a normal vector which may be perpendicular to an extension of the surface of at least one of the individual layers can be used as particular direction according to which the stack may be arranged. Thus, the substrate can be considered as a base layer on top of which the layer of the photoconductive material may be located, whereupon the cover may, further, be located on top of the layer of the photoconductive material. Such a kind of consideration may, moreover, be justified by a process of manufacturing the stack as described below in more detail, specifically by providing the substrate as the base layer and, consecutively, depositing the further layers, i.e., firstly, the layer of the photoconductive material and, thereafter, the cover. After manufacture, the stack may, as a whole, be turned in an arbitrary direction which may have, however, no influence on the arrangement and a composition of the stack. An additional coverage of the sides of the layer of the photoconductive material and, if applicable, of the substrate by the cover, such as described elsewhere herein in more detail, can, further, be left out of consideration in this regard.

In further accordance with the present invention, the stack as comprised by the optical sensor as indicated above exhibits particularly selected static mechanical properties. As used herein, the term "mechanical properties" of a body such as the stack refer to a response, also be denoted by the term "susceptibility", of the body with respect to an incident force being applied onto the body. Herein, the static mechanical properties which refer to the response or susceptibility of the body with respect to an incident static force being applied to the body are accessible by performing quasi-static nanoindenter measurements onto the body. As generally used, the "quasi-static nanoindenter measurements" relate to measurements of Young's modulus, also denoted by any one of the terms "elastic modulus" or "modulus of elasticity", and of a hardness of the body, which are, preferably, performed according to standards EN ISO 14577-1:2015 and EN ISO 14577-4:2016. As further generally used, the term "nanoindenter" refers to a probe having a tip which is designed for intruding into a very small volume of a specimen comprising the stack in order to perform the quasi-static nanoindenter measurements. For this purpose, the tip of the nanoindenter may, preferably, comprise a pyramidal geometry, wherein a "Berkovich tip" according to the standard EN ISO 14577-2:2015 may particularly be preferred. For further details with respect to the quasi-static nanoindenter measurements, the probes involved, and the results obtained, reference may be made to the standards as mentioned herein.

Accordingly, the Young's modulus of the body refers to a tensile elasticity of the body which relates a tendency of the body to experience a deformation along an axis in an event in which forces are applied along that axis. In particular, Young's modulus is defined as a ratio of a tensile stress to a tensile strain, wherein the tensile stress is measured in GPa and relates to a ratio of a force inducing the deformation on the body to an area to which the force is applied, and wherein the tensile strain is a dimension-less ratio of deformation of the body with respect to a reference dimension on the body. Herein, the modification of the dimension of the body may comprise a motion of the body comprising a translation and/or a rotation of the body, and/or a changes of a shape and, thus, also of a size or volume, of the body. According to the present invention, the Young's modulus is measured by using the nanoindenter as defined above. Further, the hardness of the body refers to a resistance of the body to a localized deformation of the body which is induced by a constant compression load onto the body, which can, therefore, also be measured by applying the nanoindenter. As a result, the Young's modulus and the hardness can be considered as a reliable measure for determining the static mechanical properties of the stack as comprised by the optical sensor.

Surprisingly, it has been found that the optical sensor exhibits preferred properties, as illustrated below in more detail, in an event in which the stack comprises the following properties that in a quasi-static nanoindenter measurement of the stack, the Young's modulus at a penetration depth of 100 nm is of 75 GPa to 107 GPa, preferably of 80 GPa to 102 GPa, more preferred of 86 GPa to 96 GPa;

at the penetration depth of 300 nm is of 47 to 127 GPa, preferably of 60 GPa to 114 GPa, more preferred of 74 GPa to 100 GPa; and at the penetration depth of 1000 nm is of 49 to 119 GPa, preferably of 61 GPa to 107 GPa, more preferred of 72 GPa to 96 GPa;

while the hardness at the penetration depth of 100 nm is of 1.20 GPa to 4.70 GPa, preferably of 1.78 GPa to 4.12 GPa, more preferred of 2.37 to 3.53 GPa;

at a penetration depth of 300 nm is of 1.60 GPa to 4.60 GPa, preferably of 2.10 GPa to 4.10 GPa, more preferred of 2.60 GPa to 3.60 GPa; and at the penetration depth of 1000 nm is of 1.60 GPa to 8.00 GPa, preferably of 2.67 GPa to 6.93 GPa, more preferred of 3.73 GPa to 5.87 GPa.

Not wishing to be bound by theory, the above properties, preferably, provide an appropriate description of selected parameters preferably to be balanced in producing long-term stable sensors having a desired high quality. In particular, the photoconductivity of photoconductive sensors may be highly dependent on a crystallinity of a bulk material, preferably selected from crystal structure, crystal size, bulk to surface ratio, and crystal defects. Further, the quality of the cover layer, which may serve as one or both of an activation layer to provide surface defects leading to a superior detectivity and an encapsulation in order to form and/or preserve a given state of defects, is highly dependent on a nature of its amorphous state, especially comprising a very low level of crystallinity. In case a size of the photoconductive crystallites would be small or an agglomeration and/or bonding between the crystallites would be weak, both hardness and Young's modulus would be small. In case the cover layer would be of a high crystallinity and/or the photoconductive crystallites would be large, both hardness and Young's modulus would be large. Further, both the hardness and Young's modulus characterize the connectivity and bonding between the cover layer and the photoconductive crystallites. Therefore, the hardness as well as Young's modulus both measured at different penetration depths can be considered as an ideal measure for characterizing a complex interplay of microscopic chemical parameters and their connection to the detectivity and long-term stability of the optical sensor.

In particular, an overall, long-term quality of optical sensors may, thus, be determined by measuring sensor parameters several thousands of hours after their production. In order to obtain selection criteria for high-quality long-term stable sensors according to the present invention, optical sensors were measured at 4000±50 hours after their production and their relative dark-resistance change, relative to the dark resistance directly after production, their relative detectivity change, relative to the detectivity directly after production, and their absolute maximum deviation from a linear resistivity between −10 V and +10 V were determined. Consequently, selection criteria were defined as optical sensors having a relative dark-resistance change of less than 0.1% and having a relative detectivity change of less than 0.1% and exhibiting an absolute maximum deviation from a linear resistivity between −10 V and +10 V of less than 0.1% of the dark resistance. For each optical sensor which met the indicated selection criteria, only one of the following parameters: a Young's modulus at a penetration depth of 100 nm, 300 nm, or 1000 nm, or a hardness at the penetration depth of 100 nm, 300 nm, or 1000 nm, was determined in a quasi-static nanoindenter measurement of the stack. Each measurement was performed on 30 individual optical sensors. The measurement sets for each parameter yielded mean values $\mu$ and standard deviations $\sigma$. As a result, optical sensors that show a parameter within the 1.5 $\sigma$ interval around the mean value, $\mu \pm 1.5\ \sigma$, are considered as optical sensors according to the present invention. Optical sensors that show a parameter within the $\sigma$ interval around the mean value, $\mu \pm \sigma$, are preferred optical sensors. Optical sensors that show a parameter within the 0.5 $\sigma$ interval around the mean value, $\mu \pm 0.5\ \sigma$, are especially preferred.

In a particularly preferred embodiment of the present invention, the stack as comprised by the optical sensor as indicated above may, further, exhibit particularly selected dielectric properties. Accordingly, the dielectric properties which refer to the dielectric parameters such as the dielectric loss of the body with respect to an incident electromagnetic wave being applied to the body are accessible by a microwave reflectometry experiment which may be performed at a microwave frequency of 75 GHz, wherein a "reflectivity factor" being denoted by the term "S11" is measured. As generally used, the "S11 reflectivity factor" is defined in dB as $_{10}$ log $(P_{refl}/P_{in})$, wherein $P_{in}$ denotes a power of an incident microwave impinging on the specimen comprising the stack, and wherein $P_{refl}$ denotes the power of a reflected microwave being reflected by the specimen. As a result, the S11 reflectivity factor can be considered as a reliable measure for determining the dielectric properties of the stack as comprised by the optical sensor.

Surprisingly, it has further been found that the optical sensor may exhibit the preferred properties, as illustrated below in more detail, in an event in which the stack comprises the following properties that, in a microwave reflectometry experiment at 75 GHz of the stack, a reflectivity factor S11 may be of −6.70 dB to −1.30 dB, preferably of −5.80 dB to −2.20 dB, more preferred of −4.90 dB to −3.10 dB.

Not wishing to be bound by theory, the above-indicated dielectric properties provide a further appropriate description of the selected parameters preferably to be balanced in producing the long-term stable sensors having the desired high quality. In particular, microwave reflectometry may be used to provide insight into dielectric parameters and effective mobilities of defect-based charges in conductive materials. Furthermore, microwave reflectometry may be used to detect leakages in encapsulations. In addition, microwave reflectometry may, further, be used to measure moisture. The photoconductive sensors are highly sensible for moisture since moisture may change their photoconductive properties, particularly selected from charge mobility, resistivity, and detectivity. Further, charge mobility, resistivity, detectivity, and/or dielectric loss are especially dependent on surface defects of the photoconductive crystallites, including the chemical bonds to the cover layer. Microwave reflectometry may, therefore constitute a preferred combined measure for microscopic charge mobility, resistivity, detectivity, defect structure, and moisture content that may allow monitoring a balance of complex and difficult-to-measure parameters which can, however, be considered as preferable for obtaining a high performing sensor.

In particular, the overall, long-term quality of photoconductive sensors may, thus, be determined by measuring sensor parameters several thousands of hours after their production. For each optical sensor which met the indicated selection criteria as defined above, a reflectivity factor S11 of the stack was determined in a microwave reflectometry experiment at 75 GHz. Each measurement was performed on 30 individual optical sensors. The measurement set yielded mean values $\mu$ and standard deviations $\sigma$ for the reflectivity factor S11. As already indicated above, optical sensors that show a parameter within the 1.5 $\sigma$ interval around the mean value, $\mu \pm 1.5\ \sigma$, are considered as optical sensors according to the present invention. Optical sensors that show a parameter within the $\sigma$ interval around the mean value, $\mu \pm \sigma$, are preferred optical sensors. Optical sensors that show a parameter within the 0.5 $\sigma$ interval around the mean value, $\mu \pm 0.5\ \sigma$, are especially preferred.

In a particularly preferred embodiment, the stack as comprised by the optical sensor as indicated above may, further, exhibit a particularly selected composition. As used herein, the term "composition" of the stack refers to a distribution of constituents within the stack. In this particularly preferred embodiment, wavelength-dispersive x-ray spectroscopy (WDXS) of the stack may be employed for determining features of the composition of the stack. As generally used, the terms "wavelength-dispersive x-ray spectroscopy" or "WDXS" refer to a particular method for determining chemical constituents and composition of phases on a microscale with high sensitivity and resolution. For this purpose, a specimen comprising the stack is irradiated by an electron beam, wherein the x-rays being emitted by the specimen are collimated in order to, subsequently, irradiate a known single crystal at a precise angle, wherein the single crystal diffracts the photons for being collected by a detector. Herein, the single crystal, the specimen, and the detector are precisely mounted on a goniometer, wherein a distance between the specimen and the single crystal may be equal to the distance between the single crystal and the detector. In a preferred embodiment, an automated changing unit may be employed for changing the single crystal, specifically depending on the incident energy, thus allowing an analysis of different constituents. As a result, the wavelength-dispersive x-ray spectroscopy counts only the x-rays of a single wavelength at a time In particular, the photoconductive material which may be used in the optical sensor according to the present invention may, specifically, be a lead chalcogenide, a solid solution and/or a doped variant thereof, wherein, concurrently, the cover may be an amorphous cover comprising an aluminum-containing compound selected from an oxide, a hydroxide, or a combination thereof, also denoted here as "$Al_2O_3$," for simplicity. Using the wavelength-dispersive x-ray spectroscopy, thus, allows determining the composition of the stack comprising a cover of $Al_2O_3$ covering a PbS layer being deposited on a glass substrate. Herein, the wavelength dispersive x-ray spectroscopy measurements were performed using an electron beam micro analyzer as the detector and thallium acid phthalate (TAP) or pentaerythritol, H-type (PET H) for the single crystal for the WDXS, wherein the WDXS measurements may, preferably, be performed using an acceleration voltage of 20 kV. As a result, net counts of the WDXS measurements can be determined in a peak maximum of an Al $K_{\alpha1}$ line, of a Pb $M_{\alpha1}$ line, and of a S $K_{\alpha1}$ line, respectively.

Surprisingly, it has further been found that the optical sensor may exhibit the preferred properties in an event in which the wavelength-dispersive x-ray spectroscopy of the stack using the electron beam micro analyzer and the acceleration voltage of 20 kV may result in a ratio of net counts/s·nA measured in a peak maximum of the Al $K_{\alpha1}$ line with the net counts/s·nA measured in the peak maximum of the Pb $M_{\alpha1}$ line is of 0.113 to 0.279, preferably of 0.141 to 0.251, more preferred of 0.168 to 0.224.

In a further particularly preferred embodiment, in which the lead chalcogenide of the photoconductive material as used in the optical sensor may be chosen to be lead sulfide (PbS), it has further been found that the optical sensor may exhibit the preferred properties in an event in which the wavelength-dispersive x-ray spectroscopy of the stack using the electron beam micro analyzer and the acceleration voltage of 20 kV may result in a further ratio of the net counts/s·nA measured in the peak maximum of the Al $K_{\alpha1}$ line with a sum of the net counts/s·nA measured in the Pb $M_{\alpha1}$ line and in the S $K_{\alpha1}$ line is of 0.0841 to 0.1456, preferably of 0.0944 to 0.1354, more preferred of 0.1046 to 0.1251.

Not wishing to be bound by theory, the above-indicated dielectric properties provide a further appropriate description of the selected parameters preferably to be balanced in producing the long-term stable sensors having the desired high quality. In particular, the properties of the photoconductive sensors are highly dependent on the interaction of the photoconductive crystallites and their interaction with the cover layer. The cover layer may be a conformal layer, thus following a surface shape of the photoconductive crystallites. A distribution of chemical elements may, therefore, vary along a normal of the surface. Herein, close to the substrate, the element distribution may, essentially, be identical to the element distribution of the photoconductive material, whereas close to the surface, the element distribution may be essentially identical to the cover layer, while in between, the element distribution may highly depend on a shape, size and/or agglomeration of the photoconductive crystallites as well as on a volume between crystallites. For this purpose WDX spectroscopy may be used which is known to measure element distributions not only on top of a surface but also below surfaces. WDX spectroscopy can, therefore, be used for obtaining insight into complex parameters of the composition of the crystallites and the cover layer.

In particular, the overall, long-term quality of photoconductive sensors may, thus, be determined by measuring sensor parameters several thousands of hours after their production. For each optical sensor which met the indicated selection criteria as defined above, only one of the following parameters was determined: in the wavelength-dispersive x-ray spectroscopy of the stack using the electron beam micro analyzer and the acceleration voltage of 20 kV, for sensors containing Al in the cover layer and Pb in the photoconductive layer, a ratio of net counts/s·nA measured in a peak maximum of the Al $K_{\alpha 1}$ line with the net counts/s·nA measured in the peak maximum of the Pb $M_{\alpha 1}$ line or, for sensors containing Al in the cover layer and Pb and S in the photoconductive layer, a ratio of the net counts/s·nA measured in the peak maximum of the Al $K_{\alpha 1}$ line with a sum of the net counts/s·nA measured in the Pb $M_{\alpha 1}$ line and in the S $K_{\alpha 1}$ line. Each measurement was performed on 30 individual optical sensors. The measurement set yielded mean values μ and standard deviations σ for the reflectivity factor S11. As already indicated above, optical sensors that show a parameter within the 1.5 σ interval around the mean value, μ±1.5 σ, are considered as optical sensors according to the present invention. Optical sensors that show a parameter within the σ interval around the mean value, μ±σ, are preferred optical sensors. Optical sensors that show a parameter within the 0.5 σ interval around the mean value, μ±0.5 σ, are especially preferred.

For further information with respect to the optical sensor or any components thereof, specifically to the substrate, the photoconductive material, the cover, or the electrical contacts, reference may be made to WO 2018/019921 A1 and to European patent application 19 152 511.2, filed Jan. 18, 2019.

In a further aspect of the present invention, a method of selecting an optical sensor having an overall, long-term quality is disclosed. Herein, the method comprises the following steps:
providing an optical sensor, comprising a stack, wherein the stack has
a substrate,
a layer of at least one photoconductive material which is applied to the substrate, and
a cover covering accessible surfaces of the photoconductive material, and at least two individual electrical contacts which are spatially separated from the stack and contact the layer of the photoconductive material;
measuring Young's modulus and a hardness of the stack in a quasi-static nanoindenter measurement; and
selecting the optical sensor which exhibits preferred static mechanical properties in that, in a quasi-static nanoindenter measurement of the stack, Young's modulus
at a penetration depth of 100 nm is of 75 GPa to 107 GPa,
at the penetration depth of 300 nm is of 47 GPa to 127 GPa,
at the penetration depth of 1000 nm is of 49 GPa to 119 GPa, and
a hardness
at the penetration depth of 100 nm is of 1.20 GPa to 4.70 GPa, and
at the penetration depth of 300 nm is of 1.60 GPa to 4.60 GPa
at the penetration depth of 1000 nm is of 1.60 GPa to 8.00 GPa,
wherein the penetration depth is determined with respect to a surface of the stack, or rejecting the optical sensor in an event in which the Young's modulus and the hardness of the stack deviate from the preferred static mechanical properties of the stack.

For further details concerning the method of selecting an optical sensor having an overall, long-term quality, reference may be made to the description of the optical sensor herein.

In a further aspect of the present invention, a detector for optical detection, in particular of optical radiation, especially within the infrared spectral range, specifically with regard to sensing at least one of transmissivity, absorption, emission and reflectance, provided by at least one light beam, or for determining a position of at least one object, specifically with regard to a depth or to both the depth and a width of the at least one object, is disclosed. According to the present invention, the detector for an optical detection of at least one object comprises:
at least one optical sensor as described elsewhere herein, the optical sensor comprising at least one sensor region, wherein the optical sensor is designed to generate at least one sensor signal in a manner dependent on an illumination of the sensor region by a light beam; and
at least one evaluation device, wherein the evaluation device is designed to generate at least one item of information with respect to optical radiation provided by the light beam by evaluating the sensor signal of the optical sensor.

Herein, the listed components may be separate components. Alternatively, two or more of the components may be integrated into one component. Further, the at least one evaluation device may be formed as a separate evaluation device independent from a transfer device, preferably selected from at least one of an optical lens, a mirror, a beam splitter, an optical filter, and the optical sensors, but may, preferably, be connected to the optical sensors in order to receive the sensor signal. Alternatively, the at least one evaluation device may fully or partially be integrated into the optical sensors.

According to the present invention, the detector comprises at least one of the optical sensors as described elsewhere in this document. Thus, the detector may, preferably, be designed for detecting electromagnetic radiation over a considerably wide spectral range, wherein the infrared (IR) spectral range may particularly be preferred. Herein, indium gallium arsenide (InGaAs) may especially, be selected for the photoconductive layer within the sensor region of the optical sensor for wavelengths up to 2.6 μm, indium arsenide (InAs) for wavelengths up to 3.1 μm, lead sulfide (PbS) for wavelengths up to 3.5 μm, lead selenide (PbSe) for wavelengths up to 5 μm, indium antimonide (InSb) for wavelengths up to 5.5 μm; and mercury cadmium telluride (MCT, HgCdTe) for wavelengths up 16 μm, wherein lead sulfide (PbS), a solid solution and/or a doped variant thereof may particularly be preferred.

Consequently, upon impingement of the sensor region by the light beam the at least two electrical contacts may provide the sensor signal which depends on the electrical conductivity of the photoconductive material. The term "light beam" generally refers to an amount of light emitted into a specific direction. Thus, the light beam may be a bundle of the light rays having a predetermined extension in a direction perpendicular to a direction of propagation of the light beam. Preferably, the light beam may be or may comprise one or more Gaussian light beams which may be characterized by one or more Gaussian beam parameters, such as one or more of a beam waist, a Rayleigh-length or any other beam parameter or combination of beam parameters suited to characterize a development of a beam diameter and/or a beam propagation in space. Herein, the light beam might be admitted by the object itself, i.e. might originate from the object. Additionally or alternatively, another origin of the light beam is feasible. Thus, as will be outlined in further detail below, one or more illumination sources might be provided which illuminate the object, such as by using one or more primary rays or beams, such as one or more primary rays or beams having a predetermined characteristic. In the latter case, the light beam propagating from the object to the detector might be a light beam which is reflected by the object and/or a reflection device connected to the object.

As used herein, the term "evaluation device" generally refers to an arbitrary device designed to generate the items of information, i.e. the at least one item of information with regard to sensing at least one of transmissivity, absorption, emission and reflectance, or of at least one object or for determining a position of at least one object, specifically with regard to a depth or both to the depth and a width of the at least one object. As an example, the evaluation device may be or may comprise one or more integrated circuits, such as one or more application-specific integrated circuits (ASICs), and/or one or more digital signal processors (DSPs), and/or one or more field programmable gate arrays (FPGAs), and/or one or more data processing devices, such as one or more computers, preferably one or more microcomputers and/or microcontrollers. Additional components may be comprised, such as one or more preprocessing devices and/or data acquisition devices, such as one or more devices for receiving and/or preprocessing of the sensor signals, such as one or more AD-converters and/or one or more filters. As used herein, the sensor signal may generally refer to one of the longitudinal sensor signal and, if applicable, to the transversal sensor signal. Further, the evaluation device may comprise one or more data storage devices. Further, as outlined above, the evaluation device may comprise one or more interfaces, such as one or more wireless interfaces and/or one or more wire-bound interfaces.

For further information with respect to the detector for optical detection or any components thereof, specifically the evaluation device, reference may be made to WO 2014/097181 A1 and WO 2018/019921 A1.

In a further aspect of the present invention, a method for manufacturing an optical sensor is disclosed. The method may, preferably, be used for manufacturing or producing at least one optical sensor according to the present invention, such as of at least one optical sensor according to one or more of the embodiments disclosed elsewhere in this document in further detail below. Thus, for optional embodiments of the method, reference might be made to the description of the various embodiments of the optical sensor.

The method comprises the following steps, which may be performed in the given order or in a different order. Further, additional method steps might be provided which are not listed. Unless explicitly indicated otherwise, two or more or even all of the method steps might be performed simultaneously, at least partially. Further, two or more or even all of the method steps might be performed twice or even more than twice, repeatedly.

The method according to the present invention comprises the following steps:
 a) providing a substrate, a layer of at least one photoconductive material which is applied to the substrate, and at least two individual electrical contacts contacting the layer of the photoconductive material; and
 b) thereafter, depositing an amorphous cover on accessible surfaces of the layer of the photoconductive material, whereby a stack comprising the substrate, the layer of the at least one photoconductive material and the cover is obtained; and
 c) measuring Young's modulus and a hardness of the stack in a quasi-static nanoindenter measurement;

wherein the method for the manufacturing of the optical sensor is performed in a manner that the optical sensor exhibits that, in the quasi-static nanoindenter measurement of the stack according to step c), the Young's modulus
 at a penetration depth of 100 nm is of 75 GPa to 107 GPa,
 at the penetration depth of 300 nm is of 47 GPa to 127 GPa,
 at the penetration depth of 1000 nm is of 49 GPa to 119 GPa, and
 the hardness
 at the penetration depth of 100 nm is of 1.20 GPa to 4.70 GPa, and
 at the penetration depth of 300 nm is of 1.60 GPa to 4.60 GPa
 at the penetration depth of 1000 nm is of 1.60 GPa to 8.00 GPa.

According to step a), a substrate, a layer of at least one photoconductive material and individual electrical contacts are provided. In particular, the respective materials for the substrate, the photoconductive layer and the electrical contacts may be selected from a list of the corresponding materials as presented above.

According to step b), the cover may be generated by using at least one of the methods as described above. Herein, step b) may be repeated at least once, preferably at least 10 times, more preferred at least 100 times. Preferably, the at least one metal-containing compound and, if applicable, the other kinds of compounds are deposited until it accomplishes a thickness of 10 nm to 600 nm, preferably of 20 nm to 200 nm, more preferred of 40 nm to 100 nm, most preferred of 50 to 95 nm. Herein, the at least one metal-containing compound and, if applicable, the other kinds of compounds are deposited in a manner that the cover may, preferably, be conformal with respect to an adjacent surface of the photoconductive material. Accordingly, the thickness of the conformal cover may follow a corresponding surface of the photoconductive material or of the substrate within a deviation of ±50 nm, preferably of ±20 nm, mostly preferred of ±10 nm, over at least 90%, preferably at least 95%, most preferred at least 99%, of a surface of the conformal cover.

In a particularly preferred embodiment of the present invention, at least one deposition method is used for depositing the metal-containing compound. Preferably, the deposition method may be selected from at least one of an atomic layer deposition (ALD) process, a chemical vapor deposition (CVD) process, a sputtering process, or a combination thereof. For further details with respect to the ALD process or the CVD process reference may be made to the description above. For the purpose of providing the metal-containing compound, two different types of precursors may, preferably, be employed, wherein a first precursor may be or comprise a metal-organic precursor, and wherein a second precursor may be or comprise a fluid. As generally used, the term "fluid" may refer to a non-solid state of the second precursor. By way of example, for providing an Al-containing compound, the first precursor may be or comprise TMA, i.e. trimethylaluminium $Al(CH_3)_3$, while the second precursor may be or comprise $H_2O$, oxygen, air or a solution thereof, or ozone. Herein, at least one of the precursors may be mixed with an inert gas, in particular $N_2$ or Ar, especially in order to provide a steady fluid flow.

As mentioned above, the desired optical sensor is, generally, designed to generate at least one sensor signal in a manner dependent on an illumination of a sensor region as comprised by the optical sensor by an incident light beam. For this purpose, at least two electrical contacts being adapted to electrically contact the photoconductive material comprised within the sensor region are further provided. In general, the electrical contacts may be provided before or during any one of the method steps a) or b). In a particularly preferred embodiment, the electrical contacts may be provided before step b), such as by providing an evaporated metal layer, such as by known evaporation techniques, wherein the metal layer may, particularly, comprise one or more of silver, aluminum, platinum, magnesium, chromium, titanium, gold, or graphene. Alternatively, the electrical contacts may be provided by a galvanic or chemically deposition process, such as electroless Ni, electroless Au, galvanic Ni, or galvanic Au. Herein, the cover may be deposited in a manner that it may also fully or partially cover the electrical contacts. In this particular embodiment, the electrical contacts are at least partially, preferably fully, covered by the cover may, thus, be bonded to at least one external connection by using electrically conductive leads, preferably in form of wires, in particular Au, Al, or Cu wires, wherein the electrically conductive leads may, especially, be bonded to the electrical contacts through the cover. By way of example, Au contacts coated by the cover may, subsequently, be contacted by wire bonds.

According to step c), the Young's modulus and the hardness of the stack is measured in a quasi-static nanoindenter measurement as described above and below in more detail.

In a particularly preferred embodiment, the method may further comprise the following step:
  d) determining a reflectivity factor S11 of the stack by applying a microwave reflectometry experiment at 75 GHz to the stack,
  as further described above and below in more detail.

In a further particularly preferred embodiment in which the photoconductive material may be selected from the group consisting of a lead chalcogenide, a solid solution and/or a doped variant thereof, wherein the lead chalcogenide may, specifically, be lead sulfide (PbS), and in which the cover may be an amorphous cover comprising an aluminum-containing compound selected from an oxide, a hydroxide, or a combination thereof, the method may further comprising the following step:
  e) performing a wavelength-dispersive x-ray spectroscopy (WDXS) of the stack by using an electron beam micro analyzer and an acceleration voltage of 20 kV,
  as also further described above and below in more detail.

As indicated above, the method for the manufacturing of the optical sensor is, thus, being performed in a fashion that the stack as comprised by the optical sensor exhibits the desired static mechanical properties and, preferably, also the desired dynamic mechanical properties and/or the desired composition.

In addition, further details concerning the manufacturing process for the optical sensor may be found elsewhere in this document.

The devices according to the present invention may be used in combination with surface mount technology packages such as bump chip carriers, ceramic leadless chip carriers, leadless chip carriers, leaded chip carriers, leaded ceramic chip carriers, dual lead-less chip carriers, plastic leaded chip carrier, package on package chip carriers, or the like. Further, devices according to the present invention may be used in combination with standard through-hole or source mount technology semiconductor packages such as DO-204, DO-213, Metal electrode leafless face, DO-214, SMA, SMB, SMC, GF1, SOD, SOT, TSOT, TO-3, TO-5, TO-8, TO-18, TO-39, TO-46, TO-66, TO-92, TO-99, TO-100, TO-126, TO-220, TO-226, TO-247, TO252, TO-263, TO-263 THIN, SIP, SIPP, DFN, DIP, DIL, Flat Pack, SO, SOIC, SOP, SSOP, TSOP, TSSOP, ZIP, LCC, PLCC, QFN, QFP, QUIP, QUIL, BGA, eWLB, LGA, PGA, COB, COF, COG, CSP, Flip Chip, PoP, QP, UICC, WL-CSP, WLP, MDIP, PDIP, SDIP, CCGA, CGA, CERPACK, CQGP, LLP, LGA, LTCC, MCM, MICRO SMDXT, or the like. Further, devices according to the present invention may be used in combination with pin grid arrays (PGA) such as OPGA, FCPGA, PAC, PGA, CPGA, or the like. Further, devices according to the present invention may be used in combination with flat packages such as CFP, CQFP, BQFP, DFN, ETQFP, PQFN, PQFP, LQFP, QFN, QFP, MQFP, HVQFP, SIDEBRAZE, TQFP, TQFN, VQFP, ODFN, or the like. Further, devices according to the present invention may be used in combination with small outline packages such as SOP, CSOP MSOP, PSOP, PSON, PSON, QSOP, SOIC, SSOP, TSOP, TSSOP, TVSOP, pMAX, WSON, or the like. Further, devices according to the present invention may be used in combination with chip-scale packages such as CSP, TCSP, TDSP, MICRO SMD, COB, COF, COG, or the like. Further, devices according to the present invention may be used in combination with ball grid arrays such as FBGA, LBGA, TEPBGA, CBGA, OBGA, TFBGA, PBGA, MAP-BGA, UCSP, μBGA, LFBGA, TBGA, SBGA, UFBGA, or the like. Further, devices according to the present invention may be combined with further electronic devices such as chips in multi-chip packages such as SiP, PoP, 3D-SiC, WSI, proximity communication, or the like. For additional information concerning integrate circuit packings reference may be made to the following sources at
  https://en.wikipedia.org/wiki/List_of_integrated_circuit_packaging_types or
  https://en.wikipedia.org/wiki/List_of_integrated_circuit_package_dimensions.

In a further aspect of the present invention, a use of a detector according to the present invention is disclosed. Therein, a use of the detector for a purpose of use is selected from the group consisting of: gas sensing, fire detection, flame detection, heat detection, smoke detection, combustion monitoring, spectroscopy, temperature sensing, motion sensing, industrial monitoring, chemical sensing, exhaust gas monitoring, a security application. In particular, the detector may be used for infra-red detection applications, heat-detection applications, thermometer applications, heat-seeking applications, flame-detection applications, fire-detection applications, smoke-detection applications, temperature sensing applications, spectroscopy applications, or the like. Further, the detector may be used to monitor exhaust gas, to monitor combustion processes, to monitor industrial processes, to monitor chemical processes, to monitor food processing processes, or the like. Further, the detector may be used for temperature control, motion control, exhaust control, gas sensing, gas analytics, motion sensing, chemical sensing, or the like. For further uses of the optical sensor and the detector as disclosed herein, reference may be made to WO 2016/120392 A1 and WO 2018/019921 A1. However, further fields of applications may still be conceivable.

The above-described optical sensor and the detector, the method, and the proposed uses have considerable advantages over the prior art. Thus, the optical sensor according to the present invention may be particularly advantageous since high performance and stability of the optical sensor could be maintained over a long time. As a result, these advantageous are favorable since they meet the particular requirements for application as a safety related-device, such as a gas sensor, a spark sensor, or a flame sensor, as well as for applications in the field of security technology.

Summarizing, in the context of the present invention, the following embodiments are regarded as particularly preferred:

Embodiment 1: An optical sensor, comprising a stack, wherein the stack has
  a substrate,
  a layer of at least one photoconductive material which is applied to the substrate, and
  a cover covering accessible surfaces of the photoconductive material, and at least two individual electrical contacts which are spatially separated from the stack and contact the layer of the photoconductive material,
wherein the optical sensor exhibits that, in a quasi-static nanoindenter measurement of the stack, Young's modulus
  at a penetration depth of 100 nm is of 75 GPa to 107 GPa,
  at the penetration depth of 300 nm is of 47 GPa to 127 GPa,
  at the penetration depth of 1000 nm is of 49 GPa to 119 GPa,
and a hardness
  at the penetration depth of 100 nm is of 1.20 GPa to 4.70 GPa,
  at the penetration depth of 300 nm is of 1.60 GPa to 4.60 GPa,
  at the penetration depth of 1000 nm is of 1.60 GPa to 8.00 GPa.

Embodiment 2: The optical sensor according to the preceding embodiment, wherein the optical sensor exhibits that, in the quasi-static nanoindenter measurement of the stack, the Young's modulus
  at the penetration depth of 100 nm is of 80 GPa to 102 GPa,
  at the penetration depth of 300 nm is of 60 GPa to 114 GPa,
  at the penetration depth of 1000 nm is of 61 GPa to 107 GPa, and
the hardness
  at the penetration depth of 100 nm is of 1.78 GPa to 4.12 GPa
  at the penetration depth of 300 nm is of 2.10 GPa to 4.10 GPa,
  at the penetration depth of 1000 nm is of 2.67 GPa to 6.93 GPa.

Embodiment 3: The optical sensor according to the preceding embodiment, wherein the optical sensor exhibits the following properties that, in the quasi-static nanoindenter measurement of the stack,
the Young's modulus
  at the penetration depth of 100 nm is of 86 GPa to 96 GPa,
  at the penetration depth of 300 nm is of 74 GPa to 100 GPa,
  at the penetration depth of 1000 nm is of 72 GPa to 96 GPa, and
the hardness
  at the penetration depth of 100 nm is of 2.37 GPa to 3.53 GPa,
  at the penetration depth of 300 nm is of 2.60 GPa to 3.60 GPa,
  at the penetration depth of 1000 nm is of 3.73 GPa to 5.87 GPa.

Embodiment 4: The optical sensor according to any one of the preceding embodiments, wherein the optical sensor exhibits that, in a microwave reflectometry experiment at 75 GHz of the stack, a reflectivity factor S11 is of −6.70 dB to −1.30 dB.

Embodiment 5: The optical sensor according to the preceding embodiment, wherein the optical sensor exhibits that, in the microwave reflectometry experiment at 75 GHz of the stack, the reflectivity factor S11 is of −5.80 dB to −2.20 dB.

Embodiment 6: The optical sensor according to the preceding embodiment, wherein the optical sensor exhibits the following properties that, in the microwave reflectometry experiment at 75 GHz of the stack, the reflectivity factor S11 is of −4.90 dB to −3.10 dB.

Embodiment 7: The optical sensor according to any one of the preceding embodiments, wherein the photoconductive material comprises an inorganic photoconductive material.

Embodiment 8: The optical sensor according to the preceding embodiment, wherein the inorganic photoconductive material comprises one or more of selenium, tellurium, a selenium-tellurium alloy, a photoconductive metal oxide, a group IV element or compound, a III-V compound, a II-VI compound, a chalcogenide, a pnictogenide, a halide, and solid solutions and/or doped variants thereof.

Embodiment 9: The optical sensor according to the preceding embodiment, wherein the chalcogenide is selected from a group comprising sulfide chalcogenides, selenide chalcogenides, telluride chalcogenides, ternary chalcogenides, quaternary and higher chalcogenides.

Embodiment 10: The optical sensor according to the preceding embodiment, wherein the sulfide chalcogenide is selected from a group comprising lead sulfide (PbS), cadmium sulfide (CdS), zinc sulfide (ZnS), mercury sulfide (HgS), silver sulfide ($Ag_2S$), manganese sulfide (MnS), bismuth trisulfide ($Bi_2S_3$), antimony trisulfide ($Sb_2S_3$), arsenic trisulfide ($As_2S_3$), tin (II) sulfide (SnS), tin (IV) disulfide ($SnS_2$), indium sulfide ($In_2S_3$), copper sulfide (CuS), cobalt sulfide (CoS), nickel sulfide (NiS), molybdenum disulfide ($MoS_2$), iron disulfide ($FeS_2$), chromium trisulfide ($CrS_3$), copper indium sulfide (CIS), copper indium gallium selenide (CIGS), copper zinc tin sulfide (CZTS), and solid solutions and/or doped variants thereof.

Embodiment 11: The optical sensor according to any one of the two preceding embodiments, wherein the selenide chalcogenide is selected from a group comprising lead selenide (PbSe), cadmium selenide (CdSe), zinc selenide (ZnSe), bismuth triselenide ($Bi_2Se_3$), mercury selenide (HgSe), antimony triselenide ($Sb_2Se_3$), arsenic triselenide ($As_2Se_3$), nickel selenide (NiSe), thallium selenide (TlSe), copper selenide (CuSe), molybdenum diselenide ($MoSe_2$), tin selenide (SnSe), cobalt selenide (CoSe), indium selenide ($In_2Se_3$), copper zinc tin selenide (CZTSe), and solid solutions and/or doped variants thereof.

Embodiment 12: The optical sensor according to any one of the three preceding embodiments, wherein the telluride chalcogenide is selected from a group comprising lead telluride (PbTe), cadmium telluride (CdTe), zinc telluride (ZnTe), mercury telluride (HgTe), bismuth tritelluride ($Bi_2Te_3$), arsenic tritelluride ($As_2Te_3$), antimony tritelluride ($Sb_2Te_3$), nickel telluride (NiTe), thallium telluride (TlTe), copper telluride (CuTe), molybdenum ditelluride ($MoTe_2$), tin telluride (SnTe), and cobalt telluride (CoTe), silver telluride ($Ag_2Te$), indium telluride ($In_2Te_3$), and solid solutions and/or doped variants thereof.

Embodiment 13: The optical sensor according to any one of the four preceding embodiments, wherein the ternary chalcogenide is selected from a group comprising mercury cadmium telluride (HgCdTe), mercury zinc telluride (HgZnTe), mercury cadmium sulfide (HgCdS), lead cadmium sulfide (PbCdS), lead mercury sulfide (PbHgS), copper indium disulfide ($CuInS_2$), cadmium sulfoselenide (CdSSe), zinc sulfoselenide (ZnSSe), thallous sulfoselenide (TlSSe), cadmium zinc sulfide (CdZnS), cadmium chromium sulfide ($CdCr_2S_4$), mercury chromium sulfide (HgCr$_2$S$_4$), copper chromium sulfide (CuCr$_2$S$_4$), cadmium lead selenide (CdPbSe), copper indium diselenide (CuInSe$_2$), indium gallium arsenide (InGaAs), lead oxide sulfide (Pb$_2$OS), lead oxide selenide (Pb$_2$OSe), lead sulfoselenide (PbSSe), arsenic selenide telluride (As$_2$Se$_2$Te), indium gallium phosphide (InGaP), gallium arsenide phosphide (GaAsP), aluminum gallium phosphide (AlGaP), cadmium selenite (CdSeO$_3$), cadmium zinc telluride (CdZnTe), cadmium zinc selenide (CdZnSe), a copper-zinc-tin sulfurselenium chalcogenide (CZTSSe), and solid solutions and/or doped variants thereof.

Embodiment 14: The optical sensor according to any one of the preceding embodiments, wherein the photoconductive material is selected from a lead chalcogenide, a solid solution and/or a doped variant thereof.

Embodiment 15: The optical sensor according to the preceding embodiment, wherein the photoconductive material is selected from lead sulfide (PbS), a solid solution and/or a doped variant thereof.

Embodiment 16: The optical sensor according to any one of the preceding embodiments, wherein the cover is an amorphous cover which comprises at least one metal-containing compound.

Embodiment 17: The optical sensor according to the preceding embodiment, wherein the at least one metal-containing compound comprises a metal or a semimetal, wherein the metal is selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, and Bi, and wherein the semimetal is selected from the group consisting of B, Si, Ge, As, Sb, and Te.

Embodiment 18: The optical sensor according to the preceding embodiment, wherein the at least one metal-containing compound comprises a metal selected from the group consisting of Al, Ti, Ta, Mn, Mo, Zr, Hf, and W.

Embodiment 19: The optical sensor according to any one of the preceding embodiments, wherein the at least one metal-containing compound is selected from the group comprising an oxide, a hydroxide, a chalcogenide, a pnictide, a carbide, or a combination thereof.

Embodiment 20: The optical sensor according to any one of the four preceding embodiments, wherein the cover comprises an aluminum-containing compound selected from an oxide, a hydroxide, or a combination thereof.

Embodiment 21: The optical sensor according to Embodiments 14 and 20, wherein the optical sensor further exhibits that, in a wavelength-dispersive x-ray spectroscopy of the stack using an electron beam micro analyzer and an acceleration voltage of 20 kV, a ratio of net counts/s·nA measured in a peak maximum of an Al K$_{\alpha 1}$ line with the net counts/s·nA measured in the peak maximum of a Pb M$_{\alpha 1}$ line is of 0.113 to 0.279.

Embodiment 22: The optical sensor according to the preceding embodiment, wherein the optical sensor further exhibits that in the wavelength-dispersive x-ray spectroscopy of the stack using an electron beam micro analyzer and an acceleration voltage of 20 kV, the ratio of net counts/s·nA measured in the peak maximum of the Al K$_{\alpha 1}$ line with the net counts/s·nA measured in the peak maximum of the Pb M$_{\alpha 1}$ line is of 0.141 to 0.251.

Embodiment 23: The optical sensor according to the preceding embodiment, wherein the optical sensor further exhibits that in the wavelength-dispersive x-ray spectroscopy of the stack using an electron beam micro analyzer and an acceleration voltage of 20 kV, the ratio of net counts/s·nA measured in the peak maximum of the Al K$_{\alpha 1}$ line with the net counts/s·nA measured in the peak maximum of the Pb M$_{\alpha 1}$ line is of 0.168 to 0.224.

Embodiment 24: The optical sensor according to Embodiments 15 and 20, wherein the optical sensor further exhibits that, in the wavelength-dispersive x-ray spectroscopy of the stack using an electron beam micro analyzer and an acceleration voltage of 20 kV, a further ratio of the net counts/s·nA measured in the peak maximum of the Al K$_{\alpha 1}$ line with a sum of the net counts/s·nA measured in the Pb M$_{\alpha 1}$ line and in an S K$_{\alpha 1}$ line is of 0.0841 to 0.1456.

Embodiment 25: The optical sensor according to the preceding embodiment, wherein the optical sensor further exhibits that in the wavelength-dispersive x-ray spectroscopy of the stack using an electron beam micro analyzer and an acceleration voltage of 20 kV, the further ratio of the net counts/s·nA measured in the peak maximum of the Al K$_{\alpha 1}$ line with the sum of the net counts/s-nA measured in the Pb M$_{\alpha 1}$ line and in the S K$_{\alpha 1}$ line is of 0.0944 to 0.1354.

Embodiment 26: The optical sensor according to the preceding embodiment, wherein the optical sensor further exhibits that in the wavelength-dispersive x-ray spectroscopy of the stack using an electron beam micro analyzer and an acceleration voltage of 20 kV, the further ratio of the net counts/s·nA measured in the peak maximum of the Al K$_{\alpha 1}$ line with the sum of the net counts/s-nA measured in the Pb M$_{\alpha 1}$ line and in the S K$_{\alpha 1}$ line is of 0.1046 to 0.1251.

Embodiment 27: The optical sensor according to any one of the preceding embodiments, wherein the cover coats a top and sides of the layer of the photoconductive material.

Embodiment 28: The optical sensor according to the preceding embodiment, wherein the cover further coats at least the sides of the substrate.

Embodiment 29: The optical sensor according to any one of the preceding embodiments, wherein the cover fully covers the accessible surface of both the layer of the photoconductive material and of the sides of the substrate.

Embodiment 30: The optical sensor according to the preceding embodiment, wherein the cover is a continuous coating.

Embodiment 31: The optical sensor according to any one of the preceding embodiments, wherein the cover has a thickness of 10 nm to 600 nm, preferably of 20 nm to 200 nm, more preferred of 40 nm to 120 nm, most preferred of 50 to 95 nm.

Embodiment 32: The optical sensor according to any one of the preceding embodiments, wherein the cover is a conformal cover with respect to an adjacent surface of a coated layer, Embodiment 33: The optical sensor according to the preceding embodiment, wherein the thickness of the conformal cover follows a corresponding surface of the photoconductive material and of the substrate within a deviation of ±50 nm, preferably of ±20 nm, mostly preferred of ±10 nm, over at least 90%, preferably at least 95%, most preferred at least 99%, of a surface of the cover.

Embodiment 34: The optical sensor according to any one of the preceding embodiments, wherein the cover is or comprises an atomic deposition coating or a chemical vapor deposition coating.

Embodiment 35: The optical sensor according to any one of the preceding embodiments, wherein the cover at least partially covers the electrical contacts.

Embodiment 36: The optical sensor according to the preceding embodiment, wherein the electrical contacts are bondable, preferably by using wires, in particular Au, Al, or Cu wires.

Embodiment 37: The optical sensor according to any one of the preceding embodiment, the electrical contacts are bondable through the cover.

Embodiment 38: The optical sensor according to any one of the preceding embodiments, wherein the at least two electrical contacts are applied at different locations of the layer of the photoconductive material.

Embodiment 39: The optical sensor according to any one of the preceding embodiments, wherein the electrical contacts comprise at least one electrode material selected from the group consisting of Ag, Pt, Mo, Al, Au, and graphene.

Embodiment 40: The optical sensor according to the preceding embodiment, wherein an adhesive layer is provided at the electrical contacts, wherein the adhesive layer is adapted for bonding.

Embodiment 41: The optical sensor according to the preceding embodiment, wherein the adhesive layer comprises at least one of Ni, Cr, Ti or Pd.

Embodiment 42: The optical sensor according to any one of the preceding embodiments, wherein the substrate has a thickness of 10 µm to 1000 µm, preferably of 50 µm to 500 µm, more preferred of 100 µm to 250 µm.

Embodiment 43: The optical sensor according to any one of the preceding embodiments, wherein at least one of the cover and the substrate is optically transparent within a wavelength range.

Embodiment 44: The optical sensor according to any one of the preceding embodiments, wherein the substrate is an electrically insulating substrate.

Embodiment 45: The optical sensor according to any one of the preceding embodiments, wherein the substrate comprises one of glass or quartz.

Embodiment 46: The optical sensor according to any one of the preceding embodiments, wherein the substrate is directly or indirectly applied to a circuit carrier device.

Embodiment 47: The optical sensor according to any one of the three preceding embodiments, wherein the circuit carrier device is a printed circuit board.

Embodiment 48: A detector for an optical detection of at least one object, comprising:
- at least one optical sensor according to any one of the preceding embodiments, the optical sensor comprising at least one sensor region, wherein the optical sensor is designed to generate at least one sensor signal in a manner dependent on an illumination of the sensor region by a light beam; and
- at least one evaluation device, wherein the evaluation device is designed to generate at least one item of information with respect to optical radiation provided by the light beam by evaluating the sensor signal of the optical sensor.

Embodiment 49: The detector according to the preceding embodiment, wherein the detector is adapted to generate the sensor signal by one or more of measuring an electrical resistance or a conductivity of at least one part of the sensor region.

Embodiment 50: The detector according to the preceding embodiment, wherein the detector is adapted to generate the sensor signal by performing at least one current-voltage measurement and/or at least one voltage-current-measurement.

Embodiment 51: The detector according to any one of the preceding embodiments relating to a detector, wherein the detector further comprises at least one transfer device, the transfer device being adapted to guide the light beam onto the optical sensor.

Embodiment 52: A method for manufacturing an optical sensor, the method comprising the following steps:
a) providing a substrate, a layer of at least one photoconductive material which is applied to the substrate, and at least two individual electrical contacts contacting the layer of the photoconductive material; and
b) thereafter, depositing a cover on accessible surfaces of the layer of the photoconductive material, whereby a stack comprising the substrate, the layer of the at least one photoconductive material and the cover is obtained; and
c) measuring Young's modulus and a hardness of the stack in a quasi-static nanoindenter measurement;

wherein the method for the manufacturing of the optical sensor is performed in a manner that the optical sensor exhibits that, in the quasi-static nanoindenter measurement of the stack according to step c), the Young's modulus
- at a penetration depth of 100 nm is of 75 GPa to 107 GPa,
- at the penetration depth of 300 nm is of 47 GPa to 127 GPa,
- at the penetration depth of 1000 nm is of 49 GPa to 119 GPa, and a hardness
- at the penetration depth of 100 nm is of 1.20 GPa to 4.70 GPa, and
- at the penetration depth of 300 nm is of 1.60 GPa to 4.60 GPa
- at the penetration depth of 1000 nm is of 1.60 GPa to 8.00 GPa.

Embodiment 53: The method according to the preceding embodiment, wherein the Young's modulus
- at the penetration depth of 100 nm is of 80 GPa to 102 GPa,
- at the penetration depth of 300 nm is of 60 GPa to 114 GPa,
- at the penetration depth of 1000 nm is of 61 GPa to 107 GPa, and the hardness
- at the penetration depth of 100 nm is of 1.78 GPa to 4.12 GPa
- at the penetration depth of 300 nm is of 2.10 GPa to 4.10 GPa,
- at the penetration depth of 1000 nm is of 2.67 GPa to 6.93 GPa.

Embodiment 54: The method according to the preceding embodiment, wherein the Young's modulus
- at the penetration depth of 100 nm is of 86 GPa to 96 GPa,
- at the penetration depth of 300 nm is of 74 GPa to 100 GPa,
- at the penetration depth of 1000 nm is of 72 GPa to 96 GPa, and the hardness
- at the penetration depth of 100 nm is of 2.37 GPa to 3.53 GPa,
- at the penetration depth of 300 nm is of 2.60 GPa to 3.60 GPa,
- at the penetration depth of 1000 nm is of 3.73 GPa to 5.87 GPa.

Embodiment 55: The method according to any one of the preceding embodiments referring to a method, wherein the method further comprises the following step:
d) determining a reflectivity factor S11 of the stack by applying a microwave reflectometry experiment at 75 GHz to the stack (125), wherein the reflectivity factor S11 is determined as of −6.70 dB to −1.30 dB.

Embodiment 56: The method according to the preceding embodiment, wherein the reflectivity factor S11 is of −5.80 dB to −2.20 dB.

Embodiment 57: The method according to the preceding embodiment, wherein the reflectivity factor S11 is of −4.90 dB to −3.10 dB.

Embodiment 58: The method according to the preceding embodiment, wherein the photoconductive material is selected from the group consisting of a lead chalcogenide, a solid solution and/or a doped variant thereof, and wherein the cover is an amorphous cover which comprises an aluminum-containing compound selected from an oxide, a hydroxide, or a combination thereof, the method further comprising the following step:
  e) performing a wavelength-dispersive x-ray spectroscopy of the stack using an electron beam micro analyzer and an acceleration voltage of 20 kV,
wherein the method for the manufacturing of the optical sensor is further performed in the manner that the optical sensor exhibits that, in the wavelength-dispersive x-ray spectroscopy of the stack using the electron beam micro analyzer and the acceleration voltage of 20 kV, a ratio of net counts/s·nA measured in a peak maximum of an Al $K_{\alpha 1}$ line with the net counts/s·nA measured in the peak maximum of a Pb $M_{\alpha 1}$ line is of 0.113 to 0.279.

Embodiment 59: The method according to the preceding embodiment, wherein the ratio of net counts/s·nA measured in the peak maximum of the Al $K_{\alpha 1}$ line with the net counts/s·nA measured in the peak maximum of the Pb $M_{\alpha 1}$ line is of 0.141 to 0.251.

Embodiment 60: The method according to the preceding embodiment, wherein the ratio of net counts/s·nA measured in the peak maximum of the Al $K_{\alpha 1}$ line with the net counts/s·nA measured in the peak maximum of the Pb $M_{\alpha 1}$ line is of 0.168 to 0.224.

Embodiment 61: The method according to any one of the three preceding embodiments, wherein the photoconductive material is selected from the group consisting of lead sulfide (PbS), a solid solution and/or a doped variant thereof, wherein the method for the manufacturing of the optical sensor is further performed in the manner that the optical sensor exhibits that, in the wavelength-dispersive x-ray spectroscopy of the stack using the electron beam micro analyzer and the acceleration voltage of 20 kV further according to step e), a further ratio of the net counts/s·nA measured in the peak maximum of the Al $K_{\alpha 1}$ line with a sum of the net counts/s·nA measured in the Pb $M_{\alpha 1}$ line and in an S $K_{\alpha 1}$ line is of 0.0841 to 0.1456.

Embodiment 62: The method according to the preceding embodiment, wherein the further ratio of the net counts/s·nA measured in the peak maximum of the Al $K_{\alpha 1}$ line with the sum of the net counts/s·nA measured in the Pb $M_{\alpha 1}$ line and in the S $K_{\alpha 1}$ line is of 0.0944 to 0.1354.

Embodiment 63: The method according to the preceding embodiment, wherein the further ratio of the net counts/s·nA measured in the peak maximum of the Al $K_{\alpha 1}$ line with the sum of the net counts/s·nA measured in the Pb $M_{\alpha 1}$ line and in the S $K_{\alpha 1}$ line is of 0.1046 to 0.1251.

Embodiment 64: The method according to any one of preceding embodiments referring to a method, wherein step b) is repeated at least once.

Embodiment 65: The method according to any one of the preceding embodiments referring to a method, wherein the cover is deposited until it accomplishes a thickness of 10 nm to 600 nm, preferably of 20 nm to 200 nm, more preferred of 40 nm to 120 nm, most preferred of 50 to 95 nm.

Embodiment 66: The method according to any one of the preceding embodiments referring to a method, wherein the cover is deposited on the top and sides of the layer of the photoconductive material and, preferably, at least the sides of the substrate, in a manner that it is a conformal cover with respect to an adjacent surface of the photoconductive material and of the substrate.

Embodiment 67: The method according to the preceding embodiment, wherein the thickness of the conformal cover follows a corresponding surface of a coated layer within a deviation of ±50 nm, preferably of ±20 nm, mostly preferred of ±10 nm, over at least 90%, preferably at least 95%, most preferred at least 99%, of a surface of the cover.

Embodiment 68: The method according to any one of the preceding embodiments referring to a method, wherein at least one deposition method is used for depositing the metal-containing compound, wherein the at least one deposition method is, preferably, selected from an atomic layer deposition process, a chemical vapor deposition process, a sputtering process, or a combination thereof, preferably the atomic layer deposition process and the combination of the atomic layer deposition process and the sputtering process.

Embodiment 69: The method according to any one of preceding embodiments referring to a method, wherein step b) is performed in a vacuum chamber.

Embodiment 70: The method according to the preceding embodiment, wherein the electrical contacts are provided before step b), wherein the cover is further partially deposited on the electrical contacts.

Embodiment 71: The method according to the preceding embodiment, wherein the electrical contacts are bonded to at least one external connection by using electrically conductive leads, preferably in form of wires, in particular Au, Al, or Cu wires.

Embodiment 72: The method according to the preceding embodiment, wherein the electrically conductive leads are bonded to the electrical contacts through the cover.

Embodiment 73: The use of a detector according to any one of the preceding claims referring to a detector, for a purpose of use, selected from the group consisting of: gas sensing, fire detection, flame detection, heat detection, smoke detection, combustion monitoring, spectroscopy, temperature sensing, motion sensing, industrial monitoring, chemical sensing, exhaust gas monitoring, a security application.

BRIEF DESCRIPTION OF THE FIGURES

Further optional details and features of the invention are evident from the description of preferred exemplary embodiments which follows in conjunction with the dependent claims. In this context, the particular features may be implemented alone or with features in combination. The invention is not restricted to the exemplary embodiments. The exemplary embodiments are shown schematically in the figures. Identical reference numerals in the individual figures refer to identical elements or elements with identical function, or elements which correspond to one another with regard to their functions.

Specifically, in the figures.

EXEMPLARY EMBODIMENTS

Figure 3:
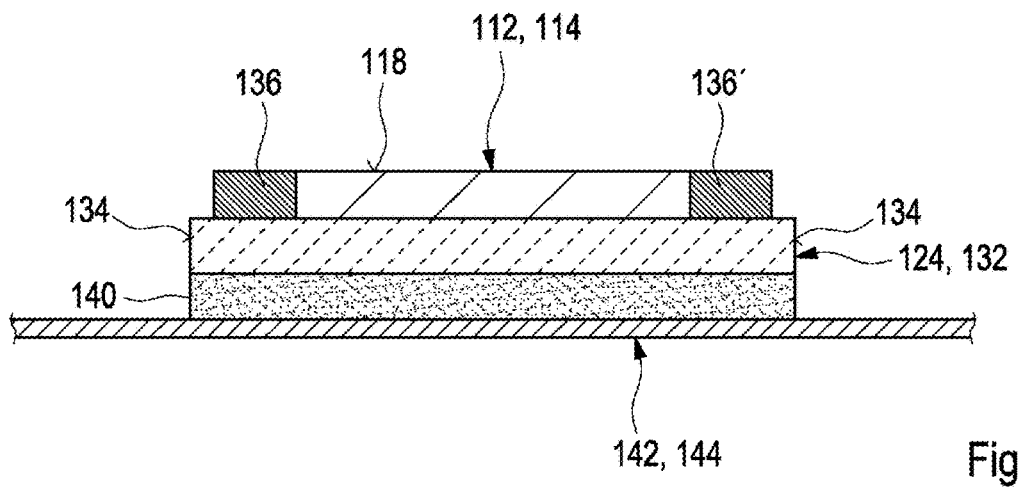
FIGS. 3A to 3F shows an exemplary embodiment of a method for manufacturing an optical sensor according to the present invention.
Figure 3:
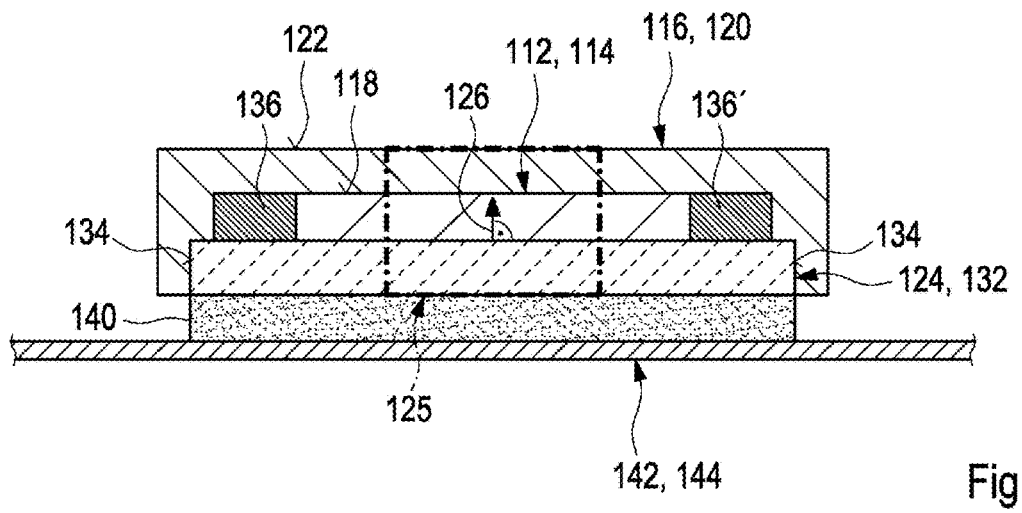
Figure 3:
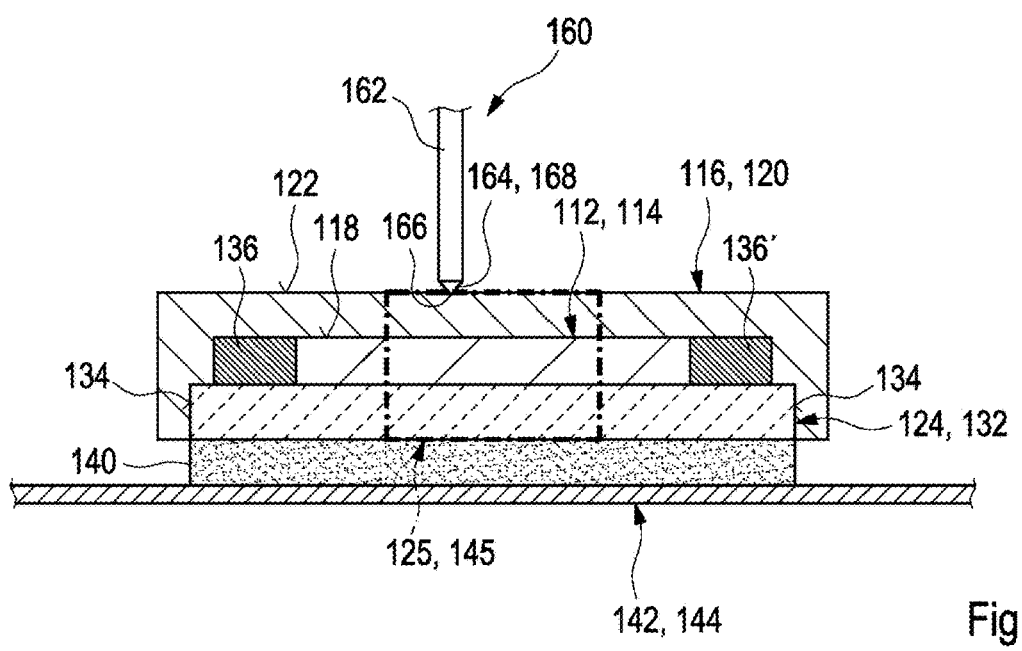
Figure 3:
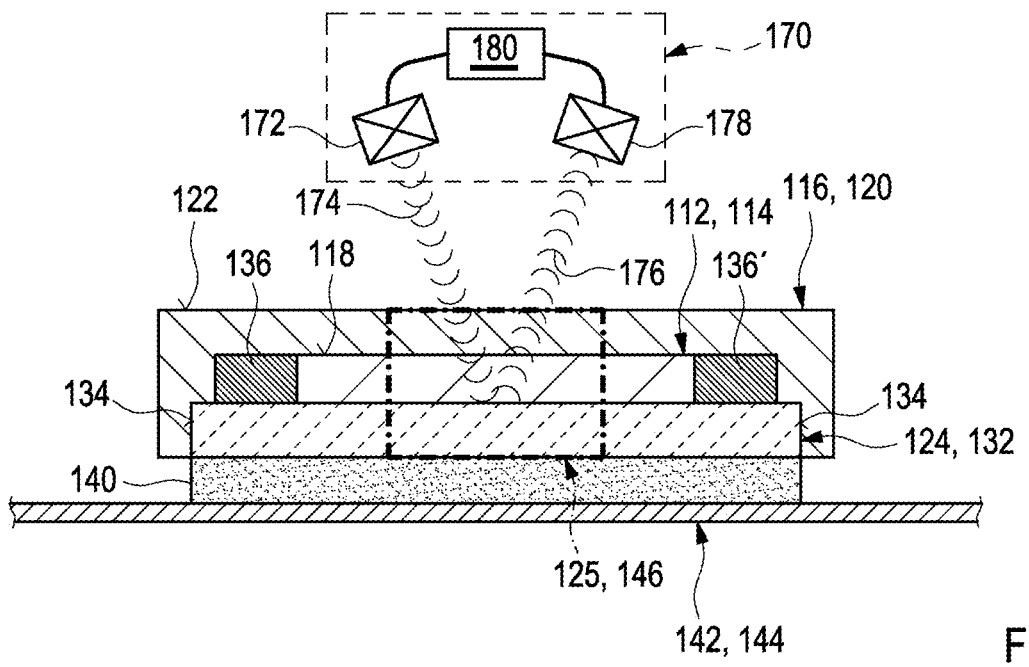
Figure 3:
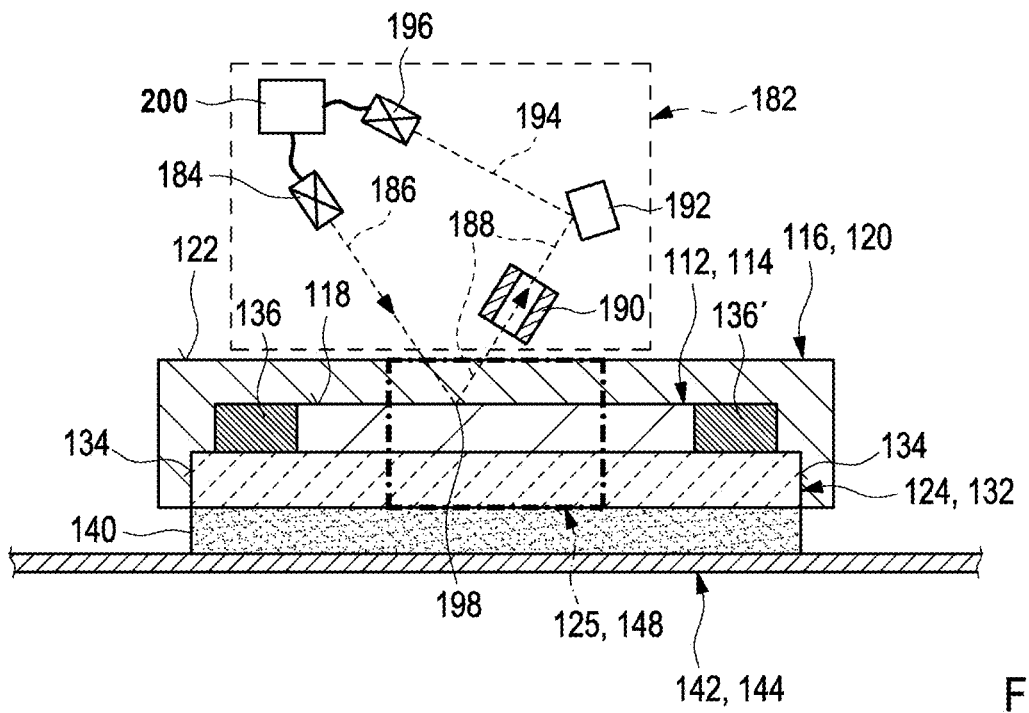
Figure 3:
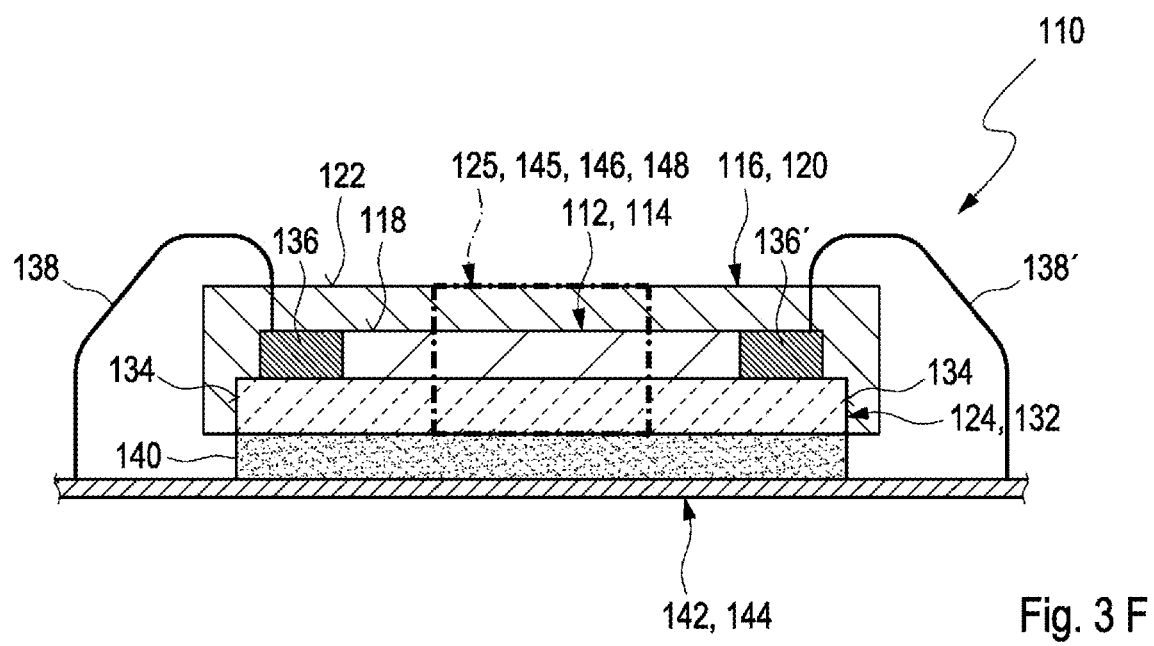

FIGS. 1A and 1B each illustrate, in a highly schematic fashion, an exemplary embodiment of an optical sensor 110 according to the present invention in a side view. Accordingly, the optical sensor 110 comprises a layer 112 of at least one photoconductive material 114. In particular, the layer 112 of the photoconductive material 114 may exhibit a thickness of 10 nm to 100 µm, preferably of 100 nm to 10 µm, more preferred of 300 nm to 5 µm. In a preferred embodiment, the layer 112 of the photoconductive material 114 may comprise an essentially flat surface, wherein, however, other embodiments which may exhibit variations of the surface of the layer 112, such as gradients or steps, may also be feasible. Herein, the layer 112 of the photoconductive material 114 may, preferably, be manufactured as described below with respect to FIG. 3. However, other manufacturing methods may also be feasible.

Figure 1:
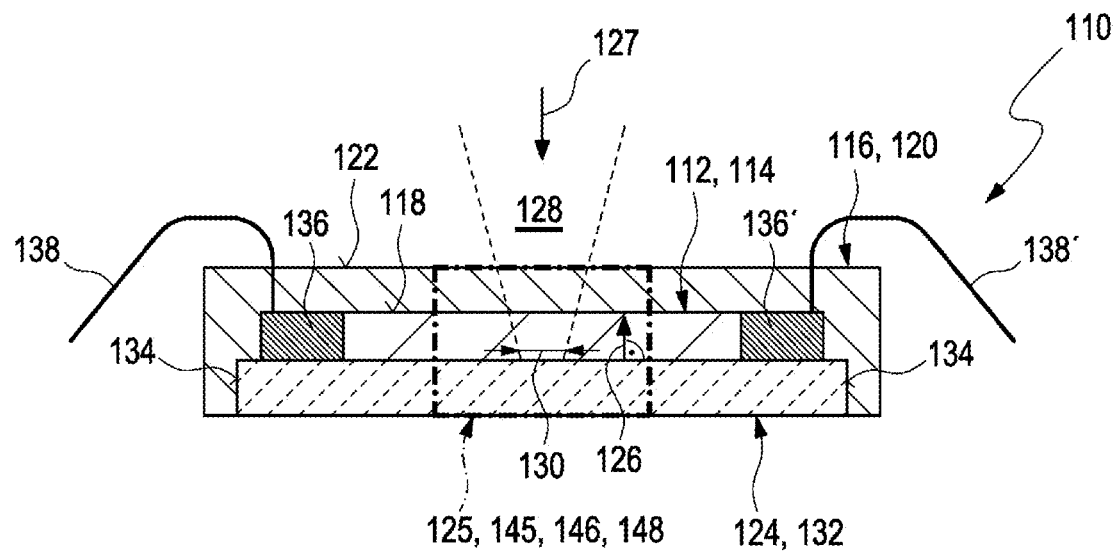
FIGS. 1A and 1B show preferred exemplary embodiments of an optical sensor according to the present invention.
Figure 1:
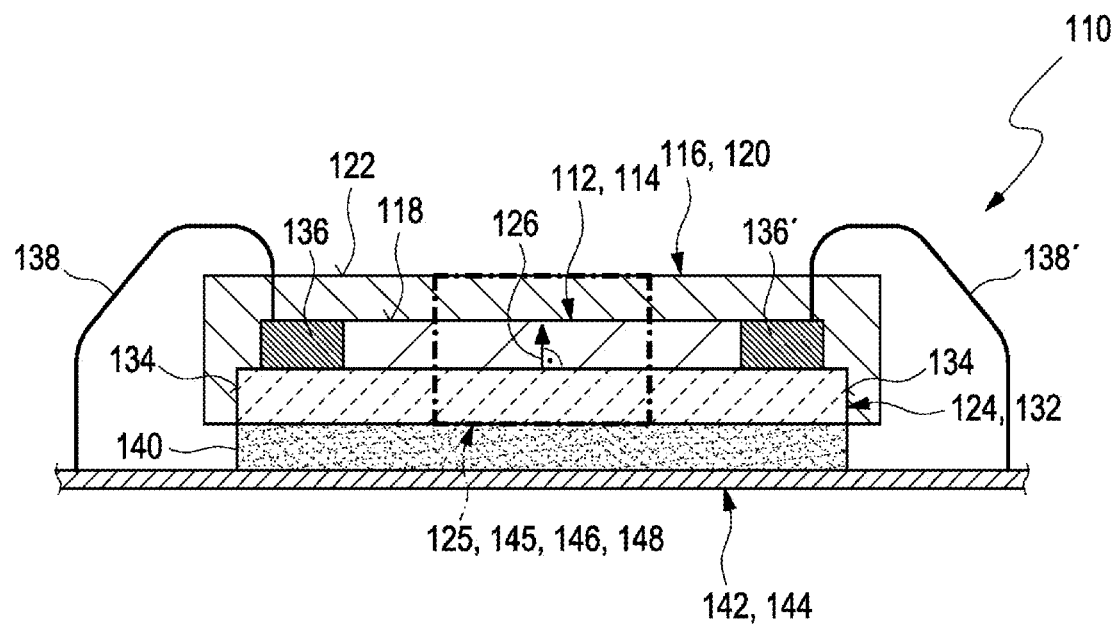

In the exemplary embodiments of FIG. 1, the photoconductive material 114 may be or comprise at least one chalcogenide which can, preferably, be selected from a group comprising sulfide chalcogenides, selenide chalcogenides, telluride chalcogenides, and ternary chalcogenides. In a particularly preferred embodiment as described herein, the photoconductive material 114 is or comprises a sulfide, preferably lead sulfide (PbS), a solid solution and/or a doped variant thereof. Since the preferred photoconductive materials 114 are, generally, known to exhibit a distinctive absorption characteristic within the infrared spectral range, the optical sensor 110 may, preferably, be used as an infrared sensor. However, other embodiments and/or other photoconductive materials, in particular, the photoconductive materials as described elsewhere in this document for the present purpose, may also be feasible.

Further, the optical sensor 110 according to the present invention comprises a cover 116, wherein the cover 116, preferably fully, covers an accessible surface 118 of the photoconductive material 114. As already described above, the cover 116 may, thus, be adapted for providing an encapsulation for the photoconductive material 114, in particular, as an hermetic package, in order to avoid a degradation of the optical sensor 110 or a partition thereof, in particular of the photoconductive material 114, by external influence, such as humidity and/or oxygen. As mentioned above, the cover 116 is an amorphous cover comprising at least one metal-containing compound 120. In a particularly preferred embodiment as described herein, the metal-containing compound 120 may comprises at least one oxide or at least one hydroxide of Al, which may also be expressed by the formula $AlO_x(OH)_y$, with $0 \leq x \leq 1.5$ and $0 \leq y \leq 1.5$, wherein $x+y=1.5$. In this particular embodiment, the cover 116 may exhibit a thickness of 10 nm to 600 nm, preferably of 20 nm to 200 nm, more preferred of 40 nm to 120 nm, most preferred of 50 to 95 nm. This range of thickness may, in particular, reflect the amount of metal-containing compounds 120 within the cover 116 that may be advantageous to achieve the above-mentioned functions of providing encapsulation for the photoconductive material 114.

Further in this particular embodiment, the cover 116 may be a conformal cover with respect to the adjacent surface 118 of the photoconductive material 114. As defined above, the thickness of the conformal cover may, thus, follow the corresponding surface 118 of the photoconductive material 114 within a deviation of ±50 nm, preferably of ±20 nm, mostly preferred of ±10 nm, wherein the deviation may occur for at least 90%, preferably for at least 95%, mostly preferred for at least 99%, of a surface 122 of the cover 116, hereby leaving aside any contamination or imperfection that may be present on the surface 122 of the cover 116.

As further illustrated in each of FIGS. 1A and 1B, the at least one layer of the photoconductive material 114 is, preferably directly, applied to at least one substrate 124, wherein the substrate 124 may, preferentially, be or comprise an insulating substrate. Herein, the thickness of the substrate 124 may be of 10 µm to 2000 µm, preferably of 50 µm to 1000 µm, more preferred of 100 µm to 500 µm. As described below in more detail, the substrate 124 may, preferably, comprise an optically transparent material 132, in particular glass or quartz. However, other substrate materials that may be partially or completely optically transparent within the infrared spectral range may also be feasible.

According to the present invention, the substrate 124, the layer 112 of the photoconductive material 114 as deposited on the substrate 124 and the cover 116 at least coating the layer 112 of the photoconductive material 114 form a stack 125. As schematically illustrated in FIGS. 1A and 1B, a normal vector 126 which may be perpendicular to an extension of the surface of the substrate 124 can be used as particular direction according to which the stack 125 may be arranged. Thus, the substrate 124 can be considered as a base layer on top of which the layer 112 of the photoconductive material 114 may be located, whereupon the cover 116 may, further, be located on top of the layer 112 of the photoconductive material 114 within the stack 125.

In order to allow an incident light beam 127 to reach the photoconductive material 114 in order to optically modify an electrical conductivity within the layer 112 of the photoconductive material 114, at least one of the cover 116 and the substrate 124 may, in particular, be optically transparent within a desired wavelength range, such as in the infrared spectral range or a partition thereof. As schematically depicted in FIG. 1A, a beam path 128 of an incident light beam 127 may be configured to pass through the cover 116 in order to generate a light spot having a diameter 130 within the layer 112 of the photoconductive material 114. As a result, it may, particularly, be advantageous to select the metal-containing compound 120 for the cover 116 to be, preferably, optically transparent within the desired wavelength range, in particular, by exhibiting a suitable absorption characteristic. In addition, it may be preferred that one or both the metal-containing compound 120 used for the cover 116 and the material applied for the substrate 124 may exhibit optically transparent properties within the desired wavelength range, such as for allowing a sensing of the light beam 127 from both directions of the optical sensor 110.

The cover 116 may, in accordance with WO 2018/019921 A1, cover the accessible surface 118 of the photoconductive material 114 but, in accordance with European patent application 19 152 511.2, filed Jan. 18, 2019, additionally cover an accessible surface 134 of the substrate 124. Preferably, the cover 116 may be applied in a manner that it may fully contact all accessible surfaces 118, 134 of the photoconductive material 114 and of the substrate 124, respectively, in order to significantly improve the long-term stability of the optical sensor 110. In particular, the cover 116 may be applied in a manner that it may directly contact a top and sides of the layer 112 of the photoconductive material 114 and at least the sides of the substrate 124. However, other kinds for providing an encapsulation for the photoconductive material 114, in particular, as hermetic package may also be feasible. As a result, the cover 116 may, thus, prevent a direct contact between the layer 112 of the photoconductive material 114 or of the substrate 124 with a surrounding atmosphere, thereby avoiding a degradation of the photoconductive material 114 by external influence, such as humidity and/or oxygen.

As further illustrated in FIGS. 1A and 1B, the optical sensor 110 according to the present invention comprises at least two individual electrical contacts 136, 136', i.e. at least one first electrical contact 136 and at least one second electrical contact 136', wherein the electrical contacts 136, 136' are adapted to contact the layer 112 of the photoconductive material 114, however, in a separate position outside from the stack 125. For this purpose, the electrical contacts 136, 136' may be configured and arranged in a manner in order to be able to guide an electrical current via the first electrical contact 136 through the layer 112 of the photoconductive material 114 to the second electrical contact 136' or vice-versa, or to apply a voltage across the layer 112 of the photoconductive material 114 by using the first electrical contact 136 and the second electrical contact 136'. For both purposes, the first electrical contact 136 may be electrically isolated from the second electrical contact 136' while both the first electrical contact 136 and the second electrical contact 136' are in direct connection with the layer 112 of the photoconductive material 114. As further illustrated herein, the cover 116 may at least partially coat the electrical contacts 136, 136', which may, especially, be configured to be bondable, such as to one or more leads 138, 138' that may lead to an external circuit as depicted in FIG. 1B.

The direct connection between any one of the electrical contacts 136, 136' and the layer 112 of the photoconductive material 114 may be provided by any known process capable of providing electrical contacts, such as plating, welding, soldering, wire bonding, thermosonic bonding, stitch-bonding, ball-bonding, wedge bonding, compliant bonding, thermocompression bonding, anodic bonding, direct bonding, plasma-activated bonding, eutectic bonding, glass frit bonding, adhesive bonding, transient liquid phase diffusion bonding, surface activated bonding, tape-automated bonding, or depositing electrically highly conductive substances at the contact zones. In order to allow a sufficient electrical conductivity through the electrical contacts 136, 136' while, concurrently, providing an sufficient mechanical stability of the electrical contacts 136, 136', the electrical contacts 136, 136' may, preferably, comprise at least one electrode material selected from the group consisting of the metals Ag, Cu, Pt, Al, Mo or Au, an alloy comprising at least one of the mentioned metals, as well as graphene. However, other kinds of electrode materials may also be feasible.

As schematically depicted in FIG. 1B, the substrate 124 may be attached, preferably via a thin film 140 of glue, to a circuit carrier device 142, in particular to a printed circuit board (PCB) 144. For this purpose, wires, such as gold wires, beryllium-doped gold wires, aluminum wires, platinum wires, palladium wires, silver wires, or copper wires, may be used as the leads 138, 138' for bonding the electrical contacts 136, 136', such as contact pads (not depicted here) on the circuit carrier device 142. In the particularly preferred embodiment as illustrated in FIG. 1B, the electrical contacts 136, 136' may be bondable through the cover 116. This feature may, in particular, allow improving the encapsulation function of the cover 116 and, concurrently, providing stability to the electrical contacts 136, 136'.

In further accordance with the present invention, the stack 125 comprised by the optical sensor 110 exhibits particularly selected static mechanical properties 145. Herein, the static mechanical properties 145 which refer to the response of the stack 125 with respect to an incident static force being applied to the stack 125 are accessible by performing quasi-static nanoindenter measurements onto the body as described below with regard to FIG. 3C in more detail. As indicated there, Young's modulus and a hardness of the stack 125 at particularly selected penetration depths, specifically of 100 nm, 300 nm, and 1000 nm, can be considered as reliable measure for determining the static mechanical properties 145 of the stack 125 comprised by the optical sensor 110. As already indicated above, it has, surprisingly, been found that the optical sensor 110 exhibits the preferred static mechanical properties 145 in an event in which the stack 125 comprises the following properties that in a quasi-static nanoindenter measurement of the stack 125, the Young's modulus at the penetration depth of 100 nm is of 75 GPa to 107 GPa, preferably of 80 GPa to 102 GPa, more preferred of 86 GPa to 96 GPa;

at the penetration depth of 300 nm is of 47 GPa to 127 GPa, preferably of 60 GPa to 114 GPa, more preferred of 74 GPa to 100 GPa; and at the penetration depth of 1000 nm is of 49 GPa to 119 GPa, preferably of 61 GPa to 107 GPa, more preferred of 72 GPa to 96 GPa;

while the hardness at the penetration depth of 100 nm is of 1.20 GPa to 4.70 GPa, preferably of 1.78 GPa to 4.12 GPa, more preferred of 2.37 GPa to 3.53 GPa;

at a penetration depth of 300 nm is of 1.60 GPa to 4.60 GPa, preferably of 2.10 GPa to 4.10 GPa, more preferred of 2.60 GPa to 3.60 GPa; and at the penetration depth of 1000 nm is of 1.60 GPa to 8.00 GPa, preferably of 2.67 GPa to 6.93 GPa, more preferred of 3.73 GPa to 5.87 GPa.

Further, the stack 125 comprised by the optical sensor 110 may, preferably, exhibit particularly selected dielectric properties 146. Herein, the dielectric properties 146 which refer to the response of the stack 125 with respect to an incident electromagnetic wave being applied to the stack 125 are accessible by a microwave reflectometry experiment which is also described below with regard to FIG. 3D in more detail. As a result, an S11 reflectivity factor can be considered as reliable measure for determining the dielectric properties 146 of the stack 125 comprised by the optical sensor 110. As already indicated above, it has, surprisingly, been found that the optical sensor 110 exhibits preferred dielectric properties 146 in an event in which the stack 125 comprises the following properties that, in a microwave reflectometry experiment at 75 GHz applied to the stack 125, a reflectivity factor S11 may be of −6.70 dB to −1.30 dB, preferably of −5.80 dB to −2.20 dB, more preferred of −4.90 dB to −3.10 dB.

Further, the stack 125 comprised by the optical sensor 110 may, preferably, exhibit a particularly selected composition 148. As further described below with regard to FIG. 3 in more detail, wavelength-dispersive x-ray spectroscopy (WDXS) of the stack 125 may, preferably, be employed for determining features of the composition 148 of the stack 125.

Herein, the photoconductive material 114 used in the optical sensor 110 may, preferably, be a lead chalcogenide, a solid solution and/or a doped variant thereof, wherein the lead chalcogenide may, specifically, be lead sulfide (PbS), wherein, concurrently, the cover 116 may be an amorphous cover comprising an aluminum-containing compound selected from an oxide, a hydroxide, or a combination thereof, also denoted as "Al$_2$O$_3$". Hereby, net counts of the WDXS measurements of the stack 125 can be determined in a peak maximum of an Al K$_{\alpha 1}$ line, of a Pb M$_{\alpha 1}$ line, and of an S K$_{\alpha 1}$ line, respectively, as described below with regard to FIG. 3E in more detail. As already indicated above, it has, surprisingly, been found that the optical sensor 110 exhibits preferred properties in an event in which the stack comprises the composition 148 being confirmed by the WDXS measurements of the stack 125 using the electron beam micro analyzer and the acceleration voltage of 20 kV, that a ratio of net counts/s·nA measured in a peak maximum of the Al K$_{\alpha 1}$ line with the net counts/s·nA measured in the peak maximum of the Pb M$_{\alpha 1}$ line may be of 0.113 to 0.279, preferably of 0.141 to 0.251, more preferred of 0.168 to 0.224 while, in the specific case of PbS used as the particular lead chalcogenide, a further ratio of the net counts/s·nA measured in the peak maximum of the Al K$_{\alpha 1}$ line with a sum of the net counts/s·nA measured in the Pb M$_{\alpha 1}$ line and in the S K$_{\alpha 1}$ line may be of 0.0841 to 0.1456, preferably of 0.0944 to 0.1354, more preferred of 0.1046 to 0.1251.

Figure 2:
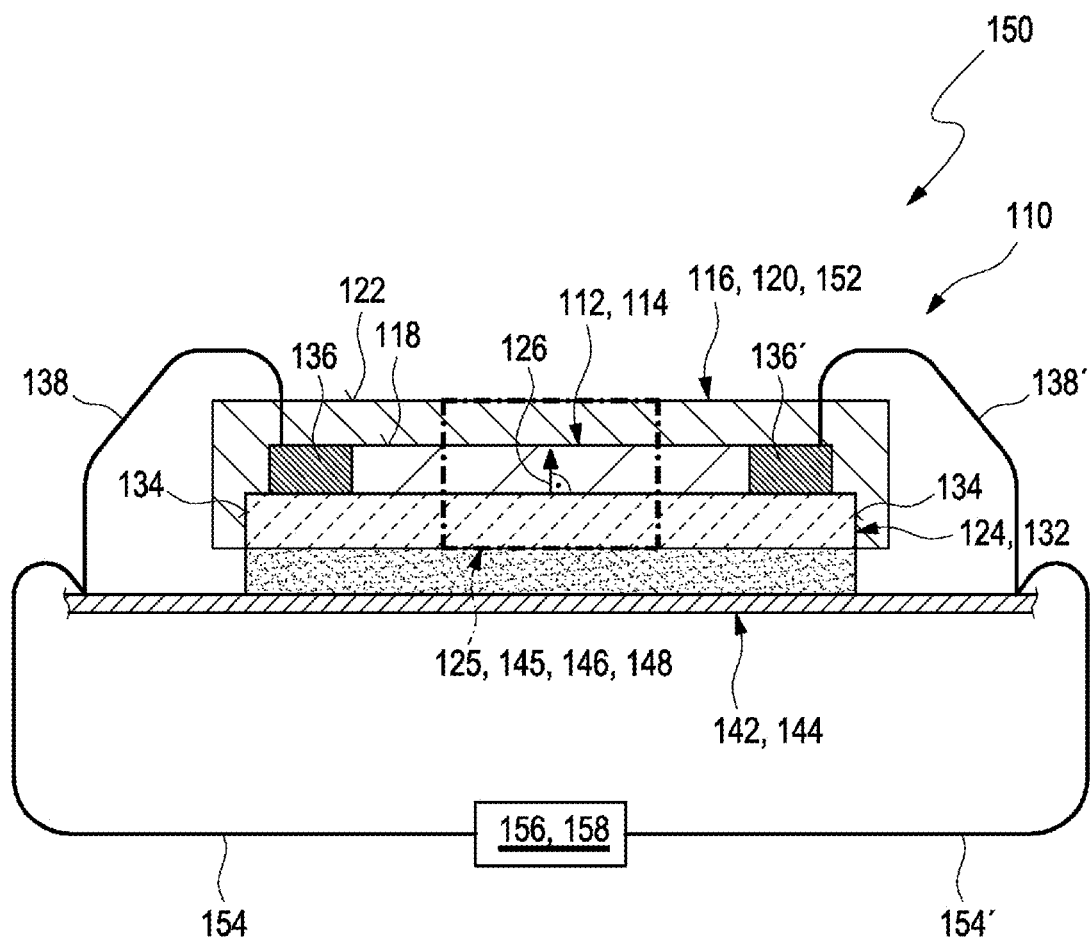
FIG. 2 shows a preferred exemplary embodiment of an optical detector according to the present invention.

FIG. 2 illustrates, in a highly schematic fashion, an exemplary embodiment of an optical detector 150 according to the present invention which may, preferably, be adapted for use as an infrared detector. However, other embodiments are feasible. The optical detector 150 comprises at least one of the optical sensors 100 as described above in more detail, which may be arranged along an optical axis of the detector 150. Specifically, the optical axis may be an axis of symmetry and/or rotation of the setup of the optical sensor 100. The optical sensor 100 may be located inside a housing of the detector 150. Further, at least one transfer device may be comprised, preferably a refractive lens. An opening in the housing, which may, particularly, be located concentrically with regard to the optical axis may, preferably, define a direction of view of the detector 150.

Further, the optical sensor 100 is designed to generate at least one sensor signal in a manner dependent on an illumination of a sensor region 152 by the light beam 127. Herein, the detector 150 may have a straight beam path or a tilted beam path, an angulated beam path, a branched beam path, a deflected or split beam path or other types of beam paths. Further, the light beam 127 may propagate along each beam path or partial beam path once or repeatedly, unidirectionally or bidirectionally.

According to the FiP effect, the optical sensor 100 may provide a sensor signal which, given the same total power of the illumination, is dependent on a beam cross-section 130 of the light beam 127 within the sensor region. However, other kinds of signals may also be feasible. As indicated above, the sensor region 152 comprises at least one of the layers 112 of the photoconductive material 114, preferably, a lead chalcogenide, a solid solution and/or a doped variant thereof, wherein the lead chalcogenide may, specifically, be lead sulfide (PbS). However, other photoconductive materials 114, in particular other chalcogenides, may be used. As a result of the use of the photoconductive material 114 in the sensor region 152, an electrical conductivity of the sensor region 152, given the same total power of the illumination, depends on the beam cross-section of the light beam 127 in the sensor region 152. Consequently, the resulting sensor signal as provided by the optical sensor 110 upon impingement by the light beam 127 may depend on the electrical conductivity of the photoconductive material 114 in the sensor region 152 and, thus, allows determining the beam cross-section 130 of the light beam 127 in the sensor region 152.

Via further electrical leads 154, 154' to which the leads 138, 138' are bonded, the sensor signal may be transmitted to an evaluation device 156, which is, generally, designed to generate at least one item of information by evaluating the sensor signal of the optical sensor 110. For this purpose, the evaluation device 156 may comprise one or more electronic devices and/or one or more software components, in order to evaluate the sensor signals. Generally, the evaluation device 156 may be part of a data processing device 158 and/or may comprise one or more data processing devices 158. The evaluation device 156 may be fully or partially integrated into the housing and/or may fully or partially be embodied as a separate device which is electrically connected in a wireless or wire-bound fashion to the optical sensor 100. The evaluation device 156 may further comprise one or more additional components, such as one or more electronic hardware components and/or one or more software components, such as one or more measurement units and/or one or more evaluation units and/or one or more controlling units (not depicted here).

FIGS. 3A to 3F illustrates, in a highly schematic fashion, an exemplary embodiment of a method for manufacturing the optical sensor 110 according to the present invention.

As illustrated in FIG. 3A, the substrate 124 is provided as a base layer on which, consecutively, the further layers are deposited. Herein, the normal vector 126 being perpendicular to the extension of the surface of the substrate 124 can be used as the particular direction according to which the stack 125 may be arranged. Preferably, prior to providing the layer 112 of the photoconductive material 114, the electrical contacts 136, 136' may be generated, such as in form of an evaporated metal layer which can be provided by known evaporation techniques on the substrate 124, preferably, comprising glass as the optically transparent material 132. In particular, the evaporated metal layer may comprise one or more of Ag, Al, Pt, Mg, Cr, Ti, or Au. Alternatively, the electrical contacts 136, 136' may comprise a layer of graphene. However, as mentioned above in more detail, other methods of generating the electrical contacts 136, 136' may also be feasible.

As further illustrated in FIG. 3A, the layer 112 of the photoconductive material 114 is, subsequently, provided. For this purpose, the photoconductive material 114 may be synthesized according to the following procedure. Accordingly, 0.015 mol/L thiourea or substituted products thereof, 0.015 mol/L lead acetate, lead nitrate, or substituted products thereof, and 0.15 mol/L sodium hydroxide or substituted products thereof are dissolved in a reaction volume, whereby a clear solution is obtained at room temperature. As known from prior art, when the solutions mentioned above are intermixed in any order, lead sulfide (PbS) precipitates out of the solution at a temperature above 30° C., usually, in such a manner that an even and relatively smooth layer may be formed on side walls and at a bottom of a liquid-containing reactor or on the walls of any object located within therein.

However, when immediately prior to the actual precipitation of PbS from the intermixed precipitating solution, an aqueous solution of an agent capable of liberating relatively abundant quantities of nascent oxygen, preferably, of potassium persulfate, hydrogen peroxide, or sodium perborate, is added thereto, PbS precipitates therefrom in the usual manner but in an activated form being capable of direct use within a cell or of additional sensitization by aging or low-temperature baking. The precipitating solution and the activating agent are preferably mixed at a temperature above 35° C. and stirred for one to three hours, during which time deposition occurs. Herein, an amount of the persulfate ion, perborate ion, or nascent oxygen from the hydrogen peroxide, expressed in moles, added to the liquid solution for precipitating PbS may, preferably, be 0.01 to 0.5 of the theoretical amount of PbS in the bath, expressed in moles, wherein the theoretical amount of PbS is that amount which would be formed if there were a total conversion of the lead and sulfur precipitating compounds to lead sulfide.

After formation of the PbS layer, an ageing step in a climate chamber, preferably at a temperature of approx. 50° C. and a humidity above 70%, may optionally be performed, which appears to be beneficial for the photoconductive performance. Improved photoconductivity may be obtained when deposited and aged films are further processed by annealing, i.e. by heating in vacuum or air at a temperature of approx. 100° C. to 150° C. for 1 to 100 hours.

However, other kinds of providing the layer 112 of the photoconductive material 114 may also be feasible.

FIG. 3B schematically illustrates depositing the metal-containing compound 120 as an amorphous cover 116 on the accessible surfaces 118,134 of the layer 112 of the photoconductive material PbS 114 and of the substrate 124, in order to function, in particular, as an encapsulation layer. For this purpose, at least one precursor which is adapted to react to the metal-containing compound 120 can be applied. In this preferred embodiment, an atomic layer deposition (ALD) process or the combination of ALD and sputtering has been used as the deposition method. Alternatively, other deposition processes, such as a chemical vapor deposition (CVD) process, may, however, also be applied.

In a preferred embodiment of the present invention, the cover 116 comprises $Al_2O_3$ which has been generated via the ALD process or the combination of an ALD process and a sputtering process. Alternatively, laminates like $Al_2O_3/TiO_2/Al_2O_3/\ldots$ or $Al_2O_3/ZrO_2/Al_2O_3/\ldots$ may also be produced. In this particular embodiment, the ALD process has been performed applying the following process parameters:
first precursor: $H_2O$;
second precursor: $Al(CH_3)_3$ (trimethylaluminum, TMA);
temperature approx. 60° C.;
approx. 700 cycles.

As further depicted in FIG. 3B, the $Al_2O_3$-comprising cover 116 may be applied in accordance with the present invention in a fashion that it may be, concurrently, coat the accessible surface 118 of the photoconductive PbS layer 112, the electrical contacts 136, 136' which may contact the photoconductive PbS layer 112, and the accessible surface 134 of the substrate 124.

As further illustrated in FIG. 3B, the stack 125 is now obtained by providing the substrate 124, depositing the layer 112 of the photoconductive material 114 onto the substrate 124 and, subsequently, the cover 116 onto at least the layer 112 of the photoconductive material 114. As schematically illustrated in FIG. 3B, the normal vector 126 being perpendicular to the extension of the surface of the substrate 124 is used herein as the particular direction of the arrangement of the stack 125.

According to the present invention, the stack 125 exhibits the particularly selected static mechanical properties 145 relating to the response of the stack 125 with respect to an incident static force being applied to the stack 125. Herein, the particularly selected static mechanical properties 145 of the stack 125 are determined by measuring Young's modulus and a hardness of the stack 125 in a quasi-static nanoindenter measurement. As schematically depicted in FIG. 3C, the quasi-static nanoindenter measurements comprise measurements of the Young's modulus and of the hardness of the body which are, preferably, performed according to standards EN ISO 14577-1:2015 and EN ISO 14577-4:2016. For this purpose, a nanoindenter 160 is used, wherein the nanoindenter comprises a probe 162 having a tip 164 which is designed for intruding into a very small volume 166 of the stack 125 in order to perform the quasi-static nanoindenter measurements. For this purpose, the tip 164 of the nanoindenter 160 may, preferably, comprise a pyramidal geometry, wherein a Berkovich tip 168 according to the standard EN ISO 14577-2:2015 may particularly be preferred. Accordingly, the Young's modulus and the hardness of the stack 125 are measured by using the nanoindenter 160, whereby the preferred static and dynamic mechanical properties 145, 146 of the stack 125 as presented above in more detail are measured. However, in an event in which the Young's modulus and the hardness of the stack 125 being measured by the nanoindenter 160 may deviate from the preferred static mechanical properties 145 of the stack 125 as indicated above, the particular sample of the optical sensor 110 can be rejected from further use in the optical detector 150.

Quasi-static nanoindenter measurements of the Young's modulus and the hardness, each at a penetration depth of 100 nm, 300 nm, and 1000 nm, respectively, were performed using the Berkovich tip on 30 individual optical sensors which hade been selected according to the selection criteria as indicated above in more detail. Accordingly, the selection criteria were defined as an optical sensor 110 having a relative dark-resistance change of less than 0.1% and having a relative detectivity change of less than 0.1% and exhibiting an absolute maximum deviation from a linear resistivity between −10 V and +10 V of less than 0.1% of the dark resistance. The following values sorted by size as presented in Table 1 were obtained from these quasi-static nanoindenter measurements:

TABLE 1

| Quasi-static Nanoindenter Measurements | | | | | |
|---|---|---|---|---|---|
| Young's modulus/GPa | | | Hardness/GPa | | |
| 100 nm | 300 nm | 1000 nm | 100 nm | 300 nm | 1000 nm |
| 76.42 | 31.78 | 42.75 | 0.56 | 1.53 | 0.32 |
| 76.61 | 42.75 | 43.21 | 1.21 | 1.57 | 1.51 |
| 76.77 | 49.24 | 49.73 | 1.23 | 1.58 | 1.62 |
| 77.08 | 51.33 | 51.15 | 1.32 | 1.81 | 2.18 |
| 77.61 | 59.01 | 51.23 | 1.52 | 1.85 | 2.74 |
| 79.71 | 64.44 | 53.97 | 1.66 | 2.13 | 3.17 |
| 80.52 | 64.78 | 54.43 | 1.84 | 2.34 | 3.39 |
| 80.85 | 65.08 | 62.04 | 2.05 | 2.46 | 3.41 |
| 82.50 | 68.36 | 69.73 | 2.09 | 2.57 | 3.48 |
| 83.33 | 69.82 | 80.13 | 2.30 | 2.70 | 3.59 |
| 84.54 | 77.00 | 82.38 | 2.37 | 2.75 | 3.77 |
| 85.59 | 77.78 | 83.33 | 2.61 | 2.75 | 3.93 |
| 88.14 | 83.76 | 84.63 | 2.96 | 2.76 | 4.05 |
| 88.48 | 84.90 | 87.97 | 3.12 | 2.80 | 4.34 |
| 89.09 | 86.04 | 88.29 | 3.12 | 2.83 | 4.35 |
| 90.42 | 88.55 | 88.33 | 3.14 | 3.01 | 4.44 |
| 90.63 | 89.95 | 88.99 | 3.28 | 3.03 | 4.68 |
| 93.48 | 94.70 | 92.03 | 3.29 | 3.35 | 5.20 |
| 93.91 | 98.77 | 92.33 | 3.58 | 3.47 | 5.74 |
| 95.40 | 100.78 | 92.49 | 3.63 | 3.48 | 5.82 |
| 98.27 | 102.84 | 94.71 | 3.67 | 3.70 | 6.03 |
| 101.57 | 104.12 | 97.84 | 3.68 | 3.71 | 6.55 |
| 101.75 | 104.96 | 97.97 | 3.85 | 3.82 | 6.69 |
| 102.63 | 108.99 | 103.16 | 3.90 | 3.87 | 6.92 |
| 102.66 | 110.59 | 104.66 | 3.90 | 3.88 | 6.99 |
| 102.91 | 111.79 | 109.81 | 3.93 | 3.93 | 7.02 |
| 103.07 | 117.60 | 109.96 | 4.04 | 4.11 | 7.06 |
| 103.23 | 125.49 | 110.83 | 4.33 | 4.44 | 7.12 |
| 111.19 | 130.25 | 125.48 | 4.58 | 5.06 | 7.87 |
| 111.63 | 144.56 | 126.43 | 5.75 | 5.71 | 10.01 |

Based on these results, the following parameters as presented in Table 2 can be determined, wherein the respective value after the sign "±" indicates ±1.5 σ, wherein σ refers to the corresponding standard deviation:

TABLE 2

Results from Quasi-static Nanoindenter Measurements (±1.5 σ)

| penetration depth/nm | Young's modulus/GPa | Hardness/GPa |
|---|---|---|
| 100 | 91 ± 16 | 2.95 ± 1.75 |
| 300 | 87 ± 40 | 3.10 ± 1.50 |
| 1000 | 84 ± 35 | 4.8 ± 3.2 |

Further according to the present invention, the stack 125 may exhibit the particularly selected dielectric properties 146 relating to the response of the stack 125 with respect to an incident electromagnetic wave being applied to the stack 125. Herein, the particularly selected dielectric properties 146 of the stack 125 may be determined in a microwave reflectometry experiment. As schematically depicted in FIG. 3D, the dielectric properties 146 of the stack 125 are determined by measuring an S11 reflectivity factor in the microwave reflectometry experiment using a microwave apparatus 170. Herein the microwave apparatus 170 may comprise a microwave emitter 172 which may generate and emits incident microwaves 174 at a frequency of 75 GHz. The incident microwaves 174 may impinge on the stack 125, wherein the stack 125 may, subsequently, reflect a partition of the incident microwaves 174 as reflected microwaves 176 which can be detected by a microwave receiver 178. A microwave evaluation unit 180 may be employed for determining the S11 reflectivity factor which is defined in dB as $_{10}$ log ($P_{refl}/P_{in}$), wherein $P_{in}$ is the power of the incident microwave 174 as provided by the microwave emitter 172 impinging on the stack 125, and wherein $P_{refl}$ is the power of the reflected microwave 176 being reflected by the stack 125 as measured by the microwave receiver 178. As a result, by measuring the S11 reflectivity factor the dielectric properties 146 of the stack 125 can be reliably be determined. However, in an event in which the S11 reflectivity factor of the stack 125 being measured by the microwave apparatus 170 may deviate from the preferred dielectric properties 146 of the stack 125 as indicated above, the particular sample of the optical sensor 110 can be rejected from further use in the optical detector 150. The following values sorted by size as presented in Table 3 were obtained from microwave reflectometry experiments on 30 individual optical sensors which had been selected according to the selection criteria as indicated above:

TABLE 3

Measurements of the S11 reflectivity factor at 75 GHz/dB

| | | | | | |
|---|---|---|---|---|---|
| −8.72 | −7.09 | −6.95 | −6.06 | −5.55 | −5.22 |
| −5.06 | −4.97 | −4.96 | −4.36 | −4.33 | −4.23 |
| −4.23 | −4.22 | −4.08 | −3.99 | −3.96 | −3.42 |
| −3.41 | −3.36 | −3.33 | −3.30 | −3.22 | −2.60 |
| −2.50 | −2.41 | −2.34 | −1.40 | −0.66 | −0.07 |

Based on these results, the measured value of the S11 reflectivity factor could be determined as −4.00 dB±2.70 dB, wherein the respective value after the sign "±" indicates 1.5 σ, wherein σ refers to the corresponding standard deviation.

In a particularly preferred embodiment, the photoconductive material 114 may, specifically, be a lead chalcogenide, specifically PbS, a solid solution and/or a doped variant thereof, wherein, concurrently, the cover 116 may be an amorphous cover comprising $Al_2O_3$. Herein, wavelength-dispersive x-ray spectroscopy (WDXS) may allow determining the composition 148 of the stack 125 comprising the cover 116 of $Al_2O_3$ which coats the PbS layer 112 being deposited on the glass substrate 124. As shown in FIG. 3E, the WDXS measurements may, preferably, be performed by using an electron beam micro analyzer 182. The electron beam micro analyzer 182 may comprise an electron source 184 for generating an incident electron beam 186, wherein the incident electro beam 186 impinges on the stack 125. As a result thereof, the stack 125 emits an x-ray beam 188 which may, subsequently, be collimated in a collimator 190 in order to, thereafter, irradiate a known single crystal 192 at a precise angle, wherein the single crystal 192 diffracts the x-ray beam 188 into a diffracted x-ray beam 194 to be collected by a detector 196.

Herein, the single crystal 192, the stack 125, and the detector 196 may be precisely mounted on a goniometer (not depicted here), wherein a distance between the stack 125 and the single crystal 192 may be equal to the distance between the single crystal 192 and the detector 196. Preferably, an acceleration voltage of 20 kV may be used for the incident electron beam 186. Further, an automated changing unit (not depicted here) for changing the single crystal 192, specifically depending on the energy of the incident electron beam 186, may be used, thereby allowing an analysis of different constituents within the composition 148 of the stack 125.

By using an WDXS evaluation unit 200, net counts of the WDXS measurements can be determined in the peak maximum of an Al $K_{α1}$ line, of a Pb $M_{α1}$ line, and of a S $K_{α1}$ line, respectively, thereby confirming the composition 148 of the stack 125. However, in an event in which the peak maxima of the indicated lines being measured by the electron beam micro analyzer 182 deviate from the preferred values as indicated above, the particular sample of the optical sensor 110 can be rejected from further use in the optical detector 150.

In order to characterize the composition 148 of $Al_2O_3$/PbS layers, a WDXS measurements were performed using a commercial electron beam micro analyzer, wherein the material for the single crystal 192 was selected from thallium acid phthalate (TAP) for measuring the Al $K_{α1}$ line and from an H-type pentaerythritol (PET H) for measuring the Pb $M_{α1}$ line, and of the S $K_{α1}$ line, respectively. For the WDXS measurements an acceleration voltage of 20 kV, a beam current of 150 nA, a measurement time of 100 s in the peak maximum, a measurement time of 20 s in the background on each side of the peak, and a measurement spot diameter of 300 μm were used. All net counts of the WDXS measurements were determined in the peak maximum of the Al $K_{α1}$ line, of the Pb $M_{α1}$ line, and of the S $K_{α1}$ line, respectively. In the particular electron beam micro analyzer 182 which was used for the WDXS measurements, for the Al measurement, the net counts of the Al $K_{α1}$ line were measured at 90.918 mm, for the Pb measurement, the net counts of the Pb $M_{α1}$ line were measured at 169.291 mm, for the S measurement, the net counts of the S $K_{α1}$ line were measured at 172.124 mm. The following values sorted by size as presented in Table 4 were obtained from WDXS experiments on 30 individual optical sensors which had been selected according to the selection criteria as indicated above:

TABLE 4

WDXS Measurements

| Gross count ratio of Al/Pb | Net count ratio of Al/(Pb + S) |
|---|---|
| 0.064 | 0.0748 |
| 0.096 | 0.0807 |
| 0.111 | 0.0816 |
| 0.128 | 0.0877 |
| 0.131 | 0.0946 |
| 0.132 | 0.0956 |
| 0.160 | 0.0963 |
| 0.161 | 0.0981 |
| 0.165 | 0.1017 |
| 0.172 | 0.1030 |
| 0.181 | 0.1077 |
| 0.186 | 0.1091 |
| 0.188 | 0.1122 |
| 0.198 | 0.1126 |
| 0.200 | 0.1129 |
| 0.200 | 0.1143 |
| 0.205 | 0.1171 |
| 0.214 | 0.1174 |
| 0.216 | 0.1202 |
| 0.229 | 0.1256 |
| 0.231 | 0.1273 |
| 0.232 | 0.1282 |
| 0.243 | 0.1288 |
| 0.246 | 0.1375 |
| 0.249 | 0.1385 |
| 0.250 | 0.1393 |
| 0.254 | 0.1439 |
| 0.261 | 0.1441 |
| 0.268 | 0.1448 |
| 0.307 | 0.1499 |

The gross count ratio of Al/Pb was determined as 0.196±0.83 while the net count ratio of Al/(Pb+S) was determined as 0.1142±0.3075, wherein, in both cases, the respective value after the sign "±" indicates 1.5 σ, wherein σ refers to the corresponding standard deviation.

As illustrated in FIG. 3F, the two electrical contacts 136, 136' which electrically contact the layer 112 of the photoconductive material 114 may, preferably finally, be bonded to at least one external connection by electrically conductive leads 138, 138', such as gold wires, which may be provided here through the cover 116. However, as mentioned above, other ways for providing electrical contacts 136, 136' to the photoconductive PbS layer 112 may also be feasible, such as by providing the leads 138, 138' already prior to depositing the amorphous cover 116, i.e. in an intermediate process step between the process steps as illustrated in FIGS. 3A and 3B. After manufacture, the stack 125 may, as a whole, be turned in an arbitrary direction which may have, however, no influence on the arrangement and the composition 148 of the stack 125.

LIST OF REFERENCE NUMBERS 110 sensor
112 layer of photoconductive material
114 photoconductive material
116 cover
118 accessible surface of the layer of the photoconductive material
120 metal-containing compound
122 surface of the cover
124 substrate
125 stack
126 normal vector
127 light beam
128 beam path
130 diameter of light beam; beam cross-section
132 optically transparent material
134 accessible surface of the substrate
136, 136' electrical contacts
138, 138' electrically connecting leads
140 thin film of glue
142 circuit carrier device
144 printed circuit board
145 static mechanical properties
146 dynamic mechanical properties
148 composition
150 optical detector
152 sensor region
154, 154' further electrical leads
156 evaluation device
158 processing device
160 nanoindenter
162 probe
164 tip
166 volume
168 Berkovich tip
170 microwave apparatus
172 microwave emitter
174 incident microwaves
176 reflected microwaves
178 microwave receiver
180 microwave evaluation unit
182 electron beam micro analyzer
184 electron source
186 incident electron beam
188 emitted x-ray beam
190 collimator
192 single crystal
194 diffracted x-ray beam
196 x-ray detector
198 spot diameter
200 WDXS evaluation unit

The invention claimed is:

1. A method of selecting an optical sensor (110) having an overall, long-term quality, the method comprising the following steps:

providing an optical sensor (110), comprising a stack (125), wherein the stack (125) has
 a substrate (124),
 a layer (112) of at least one photoconductive material (114) which is applied to the substrate (124), and
 a cover (116) covering accessible surfaces of the photoconductive material (114),
and at least two individual electrical contacts (136, 136') which are adjacent to the stack (125) and contact the layer (112) of the photoconductive material (114);
measuring Young's modulus and a hardness of the stack (125) in a quasi-static nanoindenter measurement; and
selecting the optical sensor (110) which exhibits static mechanical properties (145) in that, in a quasi-static nanoindenter measurement of the stack (125), Young's modulus
 at a penetration depth of 100 nm is of 75 GPa to 107 GPa,
 at the penetration depth of 300 nm is of 47 GPa to 127 GPa,
 at the penetration depth of 1000 nm is of 49 GPa to 119 GPa, and a hardness
 at the penetration depth of 100 nm is of 1.20 GPa to 4.70 GPa,
 at the penetration depth of 300 nm is of 1.60 GPa to 4.60 GPa, and at the penetration depth of 1000 nm is of 1.60 GPa to 8.00 GPa,
wherein the penetration depth is determined with respect to a surface of the stack (125), or
rejecting the optical sensor (110) in an event in which the Young's modulus and the hardness of the stack (125) deviate from the static mechanical properties (145) of the stack (125).

2. The method according to claim 1, wherein the static mechanical properties (145) of the stack (125) comprise that, in the quasi-static nanoindenter measurement of the stack (125), the Young's modulus
at the penetration depth of 100 nm is of 80 GPa to 102 GPa,
at the penetration depth of 300 nm is of 60 GPa to 114 GPa,
at the penetration depth of 1000 nm is of 61 GPa to 107 GPa, and the hardness
at the penetration depth of 100 nm is of 1.78 GPa to 4.12 GPa,
at the penetration depth of 300 nm is of 2.10 GPa to 4.10 GPa, and
at the penetration depth of 1000 nm is of 2.67 GPa to 6.93 GPa.

3. The method according to claim 1, wherein the static mechanical properties (145) of the stack (125) comprise that, in a microwave reflectometry experiment at 75 GHz of the stack (125), a reflectivity factor S11 is of −6.70 dB to −1.30 dB.

4. The method according to claim 3, wherein the static mechanical properties (145) of the stack (125) comprise that, in the microwave reflectometry experiment at 75 GHz of the stack (125), the reflectivity factor S11 is of −5.80 dB to −2.20 dB.

5. The method according to claim 1, wherein the cover (116) comprises an aluminum-containing compound selected from the group consisting of an oxide, a hydroxide, and a combination thereof.

6. The method according to claim 5, wherein the static mechanical properties (145) of the stack (125) comprise that, in a wavelength-dispersive x-ray spectroscopy of the stack (125) using an electron beam micro analyzer (182) and an acceleration voltage of 20 kV, a ratio of net counts/s·nA measured in a peak maximum of an Al K$\alpha$1 line with the net counts/s·nA measured in the peak maximum of a Pb M$\alpha$1 line is of 0.113 to 0.279.

7. The method according to claim 6, wherein the static mechanical properties (145) of the stack (125) comprise that in the wavelength-dispersive x-ray spectroscopy of the stack (125) using the electron beam micro analyzer (182) and the acceleration voltage of 20 kV, the ratio of net counts/s·nA measured in the peak maximum of the Al K$\alpha$1 line with the net counts/s·nA measured in the peak maximum of the Pb M$\alpha$1 line is of 0.141 to 0.251.

8. The method according to claim 5, wherein the photoconductive material (114) is selected from the group consisting of lead sulfide (PbS), a solid solution and a doped variant thereof.

9. The method according to claim 1, wherein the photoconductive material (114) is selected from the group consisting of a lead chalcogenide, a solid solution and a doped variant thereof.

10. The method according to claim 1, wherein the static mechanical properties (145) of the stack (125) comprise that, in the wavelength-dispersive x-ray spectroscopy of the stack (125) using an electron beam micro analyzer (182) and an acceleration voltage of 20 kV, a further ratio of the net counts/s·nA measured in the peak maximum of the Al K$\alpha$1 line with a sum of the net counts/s·nA measured in the Pb M$\alpha$1 line and in an S K$\alpha$1 line is of 0.0841 to 0.1456.

11. The method according to claim 10, wherein the static mechanical properties (145) of the stack (125) comprise that in the wavelength-dispersive x-ray spectroscopy of the stack (125) using the electron beam micro analyzer (182) and the acceleration voltage of 20 kV, the further ratio of the net counts/s·nA measured in the peak maximum of the Al K$\alpha$1 line with the sum of the net counts/s·nA measured in the Pb M$\alpha$1 line and in the S K$\alpha$1 line is of 0.0944 to 0.1354.

* * * * *